United States Patent
Cok et al.

(10) Patent No.: US 9,163,955 B2
(45) Date of Patent: Oct. 20, 2015

(54) ELECTRONIC SENSING SYSTEM WITH ENVIRONMENTAL SENSOR PATCHES

(75) Inventors: Ronald Steven Cok, Rochester, NY (US); Christopher J. White, Avon, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 310 days.

(21) Appl. No.: 13/600,338

(22) Filed: Aug. 31, 2012

(65) Prior Publication Data

US 2014/0062511 A1  Mar. 6, 2014

(51) Int. Cl.
*G01R 27/08* (2006.01)
*G01D 5/12* (2006.01)
*G01D 5/16* (2006.01)
*G01D 5/14* (2006.01)

(52) U.S. Cl.
CPC .. *G01D 5/12* (2013.01); *G01D 5/14* (2013.01); *G01D 5/16* (2013.01); *G01R 27/08* (2013.01)

(58) Field of Classification Search
CPC .... G01R 27/08; G01R 27/22; G06K 19/0716; G06K 19/07749; G06K 19/0723; G06K 19/0216; G01N 27/048; G01N 27/04; G01N 27/045; G01N 27/06
USPC ............. 324/691, 514, 457; 235/492; 29/593, 29/831; 340/5.61, 10.1, 572.1
See application file for complete search history.

(56) References Cited

U.S. PATENT DOCUMENTS

| | | | |
|---|---|---|---|
| 5,942,991 A * | 8/1999 | Gaudreau et al. | 340/870.16 |
| 6,163,723 A * | 12/2000 | Roberts et al. | 607/18 |
| 6,970,731 B1 | 11/2005 | Jayaraman et al. | |
| 7,114,848 B2 * | 10/2006 | Kaneko | 374/142 |
| 7,268,680 B2 | 9/2007 | Gary, Jr. | |
| 7,323,979 B2 * | 1/2008 | Eskildsen | 340/521 |
| 7,351,191 B2 | 4/2008 | Chowdhury et al. | |
| 7,461,973 B2 * | 12/2008 | Jensen | 374/103 |
| 7,533,361 B2 | 5/2009 | Edwards | |
| 7,705,721 B1 * | 4/2010 | Chen et al. | 340/518 |
| 8,220,988 B2 * | 7/2012 | Werner et al. | 374/28 |
| 2003/0033032 A1 * | 2/2003 | Lind et al. | 700/52 |
| 2004/0074959 A1 * | 4/2004 | Foth et al. | 235/375 |
| 2006/0136167 A1 * | 6/2006 | Nye | 702/127 |
| 2006/0139393 A1 * | 6/2006 | Zhang et al. | 347/19 |
| 2006/0232849 A1 * | 10/2006 | Wetsel | 359/330 |
| 2008/0204238 A1 | 8/2008 | White | |
| 2009/0058667 A1 | 3/2009 | Dixon et al. | |

(Continued)

*Primary Examiner* — Tung X Nguyen
*Assistant Examiner* — David Frederiksen
(74) *Attorney, Agent, or Firm* — Christopher J. White; Raymond L. Owens

(57) ABSTRACT

An electronic sensing system has a transceiver with input and output pads, an excitation circuit connected to the output pad, and a detection circuit connected to the input pad. An electrically-conductive sensor patch has an electrical state that changes with exposure to a corresponding environmental factor. The detection circuit detects an electrical state of the input electrical-connection pad in response to the excitation signal and the electrical state of the input pad. Several electrically-conductive sensor patches are distributed over the substrate so that they are exposed to an external environmental factor substantially contemporaneously, each having a conductance susceptible to a respective environmental factor. The output pad is electrically connected to the input pad through the sensor patches in series, so that the detection circuit detects an electrical state of the input pad in response to the excitation signal and the respective conductances of the sensor patches.

21 Claims, 9 Drawing Sheets

(56) References Cited

U.S. PATENT DOCUMENTS

| | | | |
|---|---|---|---|
| 2011/0210176 A1* | 9/2011 | King | 235/492 |
| 2011/0309931 A1* | 12/2011 | Rose | 340/539.13 |
| 2012/0116683 A1* | 5/2012 | Potyrailo et al. | 702/19 |
| 2012/0171774 A1* | 7/2012 | Cherian et al. | 436/95 |
| 2013/0056703 A1* | 3/2013 | Elian et al. | 257/9 |
| 2013/0139587 A1* | 6/2013 | Le Neel et al. | 73/335.04 |
| 2013/0284810 A1* | 10/2013 | Cok et al. | 235/492 |

* cited by examiner

ELECTRONIC SENSING SYSTEM WITH ENVIRONMENTAL SENSOR PATCHES

CROSS REFERENCE TO RELATED APPLICATIONS

Reference is made to U.S. application Ser. No. 13/600,258 filed Aug. 31, 2012, titled "ELECTRONIC SENSING SYSTEM WITH ENVIRONMENTAL SENSOR PATCH;" U.S. application Ser. No. 13/600,356 filed Aug. 31, 2012 titled "SENSING EXPOSURE TO ENVIRONMENTAL FACTORS;" and U.S. application Ser. No. 13/455,360, filed Apr. 25, 2012, titled "ELECTRONIC STORAGE SYSTEM WITH ENVIRONMENTALLY-ALTERABLE CONDUCTOR;" the disclosures of which are incorporated by reference herein in their entirety.

FIELD OF THE INVENTION

The present invention relates to sensing environmental factors.

BACKGROUND OF THE INVENTION

Radio-frequency identification (RFID) is an established technology for communicating with small electronic devices ("tags") that can be attached to pallets, packages, or product instances. RFID tags can include passive circuits in an integrated circuit (IC) that respond to a radio signal with stored identification or other data. The radio signal is provided by a "reader" (or "interrogator") that commands the tag to transmit its stored data. U.S. Patent Publication No. 2008/0204238 describes a variety of RFID-enabled devices. In this publication, the term "reader" refers to any electronic device capable of communicating with an information-storage device. The term "downlink" refers to communications from a reader to an information storage device, for example an RFID tag. The term "uplink" refers to communications from an information-storage device, for example an RFID tag to a reader.

RFID devices can be used for monitoring purposes, e.g., as disclosed in U.S. Pat. No. 7,268,680. This patent describes a tag unit having a transmitting unit coupled to wearable electronic banding material. An RFID unit with a writeable memory is coupled to the transmitting unit. The band can include one or more conductors (which can be an antenna) that complete an electronic circuit. A layer of the band can include the RFID tag IC. The RFID tag can be read to determine that it is operational. The tag can also return data indicating whether the band is still connected to the tag IC.

RFID devices can also be used for sensing. U.S. Patent Publication No. 2009/0058667 by Dixon et al. describes RFID tags connected to sensors to remotely monitor tire pressure. In this scheme, the RFID circuitry communicates with a sensor external to itself. This requires purchasing the separate sensor and connecting it to the RFID tag, which adds to the cost of the tag.

U.S. Pat. No. 6,970,731 to Jayaraman et al. describes sensors for monitoring vital signs, and specifically electrical impulses produced by a living body. However, this scheme is only useful for systems that monitor an electrical impulse. There is a need to monitor other conditions besides electrical signals.

Similarly, U.S. Pat. No. 7,351,191 to Mitchell et al. describes a sensor using multiple conductors to detect distortions of an applied electric field between the conductors. This is used to detect presence of a person in a space, e.g., the seat of a car. Mitchell et al. describe conductors embedded into a car seat assembly and surrounded with a substantially liquid-impervious but vapor-permeable material to permit using a separate temperature or humidity sensor to sense the temperature or humidity in the car and compensate for the sensed temperature or humidity when interpreting measured electric-field data. However, this scheme is also only useful for detecting objects that interact sufficiently with an electric field.

SUMMARY OF THE INVENTION

Existing schemes are limited in what they can sense. There is also a need to measure environmental conditions generally. For example, there is a need to sense the temperature of containers in which perishable goods are shipped. There is also a need to detect exposure to hazardous chemicals that may accidentally occur. There is, therefore, an ongoing need to measure a variety of environmental conditions on a low-cost information-storage device.

According to an aspect of the present invention, there is provided an electronic sensing system, comprising:
a substrate with a detection region;
a transceiver formed on a transceiver substrate separate from the substrate and affixed to the substrate, the transceiver including an output pad for making an electrical connection, an excitation circuit adapted to provide an excitation signal to the output pad, an input pad for making an electrical connection, a detection circuit connected to the input pad, and an interface responsive to a downlink signal to transmit an uplink signal representing the electrical state of the input pad; and
a plurality of sensor patches disposed over the substrate, each sensor patch disposed at least partly in the detection region, having a conductance susceptible to a respective environmental factor, and being electrically conductive before exposure to the respective environmental factor; wherein
the sensor patches are distributed over the substrate so that they are exposed to an external environmental factor substantially contemporaneously and the output pad is electrically connected to the input pad through the plurality of sensor patches in series, so that the detection circuit detects an electrical state of the input pad in response to the excitation signal and the respective conductances of each of the plurality of sensor patches.

According to another aspect of the present invention, there is provided an electronic sensing system, comprising:
a substrate with a detection region;
a transceiver formed on a transceiver substrate separate from the substrate and affixed to the substrate, the transceiver including an output pad for making an electrical connection, an excitation circuit adapted to provide an excitation signal to the output pad, an input pad for making an electrical connection, a detection circuit connected to the input pad, and an interface responsive to a downlink signal to transmit an uplink signal representing the electrical state of the input pad; and
a plurality of sensor patches disposed over the substrate, each sensor patch disposed at least partly in the detection region, having a conductance susceptible to a respective environmental factor, and being electrically conductive before exposure to the respective environmental factor, the sensor patches distributed over the substrate so that they are exposed to an external environmental factor substantially contemporaneously; wherein
the output pad is electrically connected to the input pad through the plurality of sensor patches in parallel, so that the detection circuit detects an electrical state of the input pad in response to the excitation signal and the respective conductances of each of the plurality of sensor patches.

An advantage of the present invention is that it can sense a variety of environmental conditions without requiring complex external electronics. Sensor patches produce electrical signals corresponding to environmental factors, even when those factors do not substantially interact with an electric field. In various aspects, any of several environmental factors can be sensed.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

The attached drawings are for purposes of illustration and are not necessarily to scale.

DETAILED DESCRIPTION OF THE INVENTION

In the following description, some aspects will be described in terms that would ordinarily be implemented as software programs. Those skilled in the art will readily recognize that the equivalent of such software can also be constructed in hardware. Because communications algorithms and systems are well known, the present description will be directed in particular to algorithms and systems forming part of, or cooperating more directly with, systems and methods described herein. Other aspects of such algorithms and systems, and hardware or software for producing and otherwise processing the data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1A:
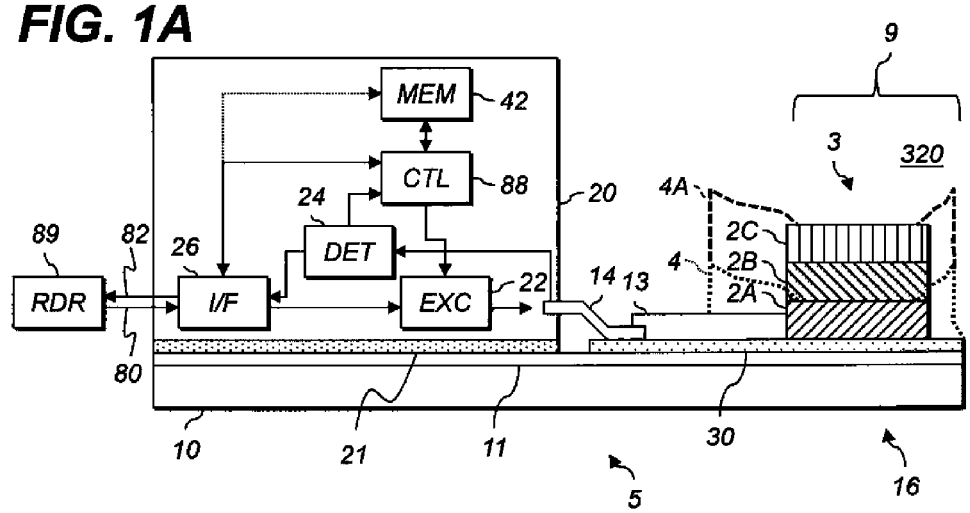
FIG. 1A is a side view of a schematic of an electronic sensing system according to various aspects.
Figure 1B:
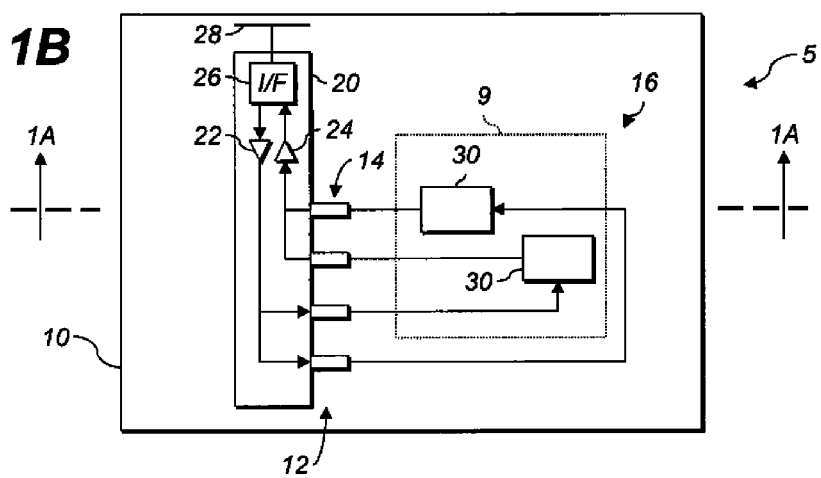
FIG. 1B is a plan view of a schematic of the electronic sensing system of FIG. 1A.

FIG. 1A is a side view, and FIG. 1B, a plan, of a schematic of an electronic sensing system according to various aspects. FIG. 1A is shown along the line 1A-1A in FIG. 1B, except for the components of transceiver 20. These components are shown schematically.

Electronic sensing system 5 includes substrate 10 having detection region 9. Transceiver 20 is formed on transceiver substrate 21 separate from substrate 10. Transceiver substrate 21 (and thus transceiver 20) is affixed to substrate 10. Code circuit 16 is separate from transceiver 20 and disposed over the substrate.

Transceiver 20 includes an output electrical-connection pad 12 (FIG. 1B) and an excitation circuit 22 adapted to provide an excitation signal to output pad 12. Output electrical-connection pad 12 is an output pad for making an electrical connection, i.e., a pad adapted to be connected to a conductor to transfer current between the pad and the conductor. A plurality of output pads 12 or excitation circuits 22 can be used in any combination; FIG. 1B shows an example of multiple output pads 12 connected to a single excitation circuit 22. Transceiver 20 also includes input electrical-connection pad 14 and detection circuit 24 connected to input pad 14. Input electrical-connection pad 12 is an input pad for making an electrical connection, i.e., a pad adapted to be connected to a conductor to transfer current between the pad and the conductor. Multiple input pads 14 or detection circuits 24 can be used in any combination; e.g., as shown, multiple input pads 14 connected to one detection circuit 24. The terms "output" and "input" do not constrain the direction or magnitude of current flow across output electrical-connection pad 12 or input electrical-connection pad 14.

Interface 26 is responsive to downlink signal 80 received from reader 89 to transmit uplink signal 82 representing the electrical state of input pad 14 to reader 89. Interface 26 can also transmit uplink signal 82 spontaneously or autonomously, e.g., at regular intervals. If multiple input pads 14 are present, uplink signal 82 can represent the state of one or more input pads 14, and one or more uplink signals 82 can be transmitted. The term "reader" here refers to any electronic device capable of causing transceiver 20 to respond with the information from code circuit 16, e.g., an RFID reader.

The term "pad" refers to a conductor that is designed to interface with a device other than transceiver 20 and that has a designated function in that interface. Pads are not designed to directly connect circuit elements within transceiver 20 unless other conductive material is added outside transceiver 20 (e.g., sensor patch 30). No particular form of pad (leg, lead, ball, bump, or other) is required.

Code circuit 16 (FIG. 1B) includes sensor patch 30 disposed over substrate 10 at least partly in detection region 9. Sensor patch 30 has an electrical state that changes with exposure to one or more corresponding environmental factors. In various aspects, sensor patch 30 is electrically conductive in an initial electrical state, i.e., before exposure to a corresponding environmental factor. Output pad 12 and input pad 14 are electrically connected to code circuit 16. Code circuit 16 can be formed directly on substrate 10 or on layers (e.g. planarization layer 11) formed on the substrate 10. Layer 11 can be a spin-coated planarization layer or a conformal coating. Code circuit 16 can include active or passive elements such as resistors, conductors, capacitors, inductors, and transistors, for example thin-film transistors.

The term "environmental factor" refers to a substance or condition that may be present in an environment to which sensor patch 30 in detection area 9 is exposed. An "environment" is not necessarily the biosphere of the Earth, but can be any volume with measurable physical, chemical, or biological properties. For example, the environmental factor can be temperature, humidity, pressure, or pH of a fluid in contact with sensor patch 30. The environmental factor can also be acceleration, altitude, or mechanical abrasion. The environmental factor can also be a chemical reaction to fluids or gases. The environmental factor can also be a mechanical stress or strain, such as that induced during abrasion, cutting, or punching, in response to mechanical forces of various strengths and velocities. The environmental factor can be a liquid or a gas.

The environmental factor can also be the presence or absence of a substance in the fluid (e.g., a specific virus or chemical). In various aspects, the substance is a chemical, organism, microorganism, or virus. The fluid can be a bodily fluid (e.g., blood, phlegm, bile, lymph, or urine). In various aspects, the environment is the environment of a living organism, such as a human body or animal. The environment can be the Earth's atmosphere, hydrosphere, or lithosphere.

Since sensor patch 30 changes electrical state with exposure to a corresponding environmental factor, and output pad 12 and input pad 14 are connected to code circuit 16 including sensor patch 30, detection circuit 24 detects an electrical state of input pad 14 in response to the excitation signal from excitation circuit 22 and the electrical state of sensor patch 30.

For example, output pad 12 can be electrically connected to input pad 14 through sensor patch 30, and the DC impedance (resistance) of sensor patch 30 can change with exposure to the environmental factor. The excitation signal can be a fixed voltage or bias across input pads 14 and output pads 12, and detection circuit 24 can include an ammeter (e.g., a Hall-effect current sensor such as the ALLEGRO ACS712) to measure the resulting current through code circuit 16. Resistance is then impressed voltage divided by measured current. Alternatively, excitation circuit 22 can supply a fixed current as the excitation signal, and detection circuit 24 can hold the voltage of input pad 14 fixed. Detection circuit 24 can then measure the voltage on output pad 12. Resistance is the quotient of the difference between the impressed voltage and the measured voltage and the impressed current. Detection circuit 24 can include an analog-to-digital converter (ADC) to measure current or voltage.

Alternatively, sensor patch 30 can be a transmitting antenna (or part of one) connected to output pad 12, and a corresponding receiving antenna can be connected to input pad 14. Sensor patch 30 can detune the transmitting antenna with exposure to the environmental factor so that the ratio of power received to power transmitted changes with exposure. The excitation signal can be an RF signal, e.g., a carrier, and the electrical state of input pad 14 can be the relative received power after the excitation signal was transmitted by sensor patch 30. Code circuit 16 can provide a DC path between output pad 12 and input pad 14, or not. Code circuit 16 can include, e.g., a resonant tank circuit of which sensor patch 30 forms part. Code circuit 16 has an electrical state correlated with the electrical states of sensor patches 30 in code circuit 16.

Layer stack 3 is disposed over sensor patch 30 in detection region 9. Layer stack 3 includes one or more layers 2A, 2B, 2C in a selected order. For example, layer stack 3 can include a plurality of layers 2A, 2B, 2C. The selected order in the example shown is from top to bottom (2C, 2B, 2A); for concentric systems with the sensor patch on the inside, the order is outside-to-inside. (The selected order can also be opposite as long as consistency is maintained.) Each layer 2A, 2B, 2C is substantially electrically insulating (e.g., $>10^6 \times$ the resistance of sensor patch 30). Layers 2A, 2B, 2C can be assembled in the selected order to form layer stack 3, then layer stack 3 can be deposited as a unit over substrate 10. Alternatively, each layer 2A, 2B, 2C can be deposited over substrate 10 individually, with the layers being deposited in the reverse of the selected order.

Each layer 2A, 2B, 2C is susceptible to a respective environmental factor. "Susceptible" means that each layer 2A, 2B, 2C (as well as sensor patch 30) changes properties, e.g., mechanically or chemically, on exposure to the environmental factor (examples are given below with respect to the term "burn-through;" "susceptibility" means at least that effects that eventually result in burn-through can occur). Layers 2A, 2B, 2C and sensor patch 30 can corrode, dissolve, change between forms of the same molecule, react, disintegrate, explode, burn, melt, freeze, or otherwise change on exposure to the factor. As used herein, "susceptibility" to an environmental factor refers to both whether a layer 2A, 2B, 2C or sensor patch 30 is susceptible to the factor and to what extent it is susceptible (e.g., reaction rate or requirement for catalysts). As used herein, "higher susceptibility" layers change electrical properties more quickly, or in response to smaller amounts of exposure, than "lower susceptibility" layers. As used herein, if a certain property of a layer changes in response to an environmental factor, the layer is said to have that property susceptible to that factor. For example, calcium changes its conductivity on exposure to water, so calcium is described as having a conductivity susceptible to water.

In some aspects, exposure to the corresponding environmental factor causes a layer to change from blocking an environmental factor (to which the layer can be susceptible or not) to permitting that environmental factor through the layer. This is referred to herein as "burn-through," but no requirement of mechanical failure or chemical oxidation (burning) is implied. A "burned-through" layer has been, in whole or in part, corroded, dissolved, moved, rearranged, caused to bead up, or otherwise removed, penetrated, or permeated, by an environmental factor to which that layer is susceptible. As a result, that environmental factor or other environmental factors can pass through the burned-through layer. The environmental factor that caused the burn-through does not necessarily pass through the burned-through layer; for example, the environmental factor can be a catalyst that catalyzes a reaction that burns through the layer so a factor other than the catalyst itself can pass. In an example, even the formation of a pinpoint void penetrating through a layer can be burn-through of that layer.

Layers 2A, 2B, 2C can be susceptible to the same environmental factor or different environmental factors, or any combination. As a result, sensor patch 30 changes electrical state in response to exposure of layer stack 3 to the respective environmental factors of the one or more layers 2A, 2B, 2C in the selected order (2C, 2B, 2A) and subsequent exposure of sensor patch 30 to the corresponding environmental factor (to which sensor patch 30 or a layer therein is susceptible). The one or more layers 2A, 2B, 2C in layer stack 3, plus sensor patch 30, together result in the electrical state of input pad 14 changing when detection region 9 has been exposed to a plurality of environmental factors in order from environment 320. Multiple environmental factors can also be present in environment 320 concurrently, so that when, e.g., layer 2C burns through due to exposure to the corresponding environmental factor, layer 2B immediately begins to degrade due to exposure to its corresponding environmental factor.

In various aspects, layer stack 3 includes exactly one layer 2A, i.e., includes layer 2A and no other layers. Sensor patch 30 also includes a layer (not shown) susceptible to the corresponding environmental factor. Seal 4 (FIG. 1A) is lower in susceptibility to the respective environmental factors of layer 2A and sensor patch 30 than the layer 2A and sensor patch 30. Seal 4 is arranged so that sensor patch 30 is permitted to be exposed to the respective environmental factor only through a void in layer 2A. A "void" is any aperture or region through which the respective environmental factor can pass. It is not required that a "void" be actually empty of material. For example, a liquid-permeable area in an otherwise liquid-impermeable layer is a "void" as used herein. In the example shown, seal 4 covers the edges of sensor patch 30 and layer 2A, leaving only the top, center area of layer 2A exposed to environment 320. As a result, sensor patch 30 is not exposed to environment 320 until layer 2A has burned through. In another example, the environmental factor is heat. A void is an area in a layer of appreciably higher thermal conductivity (e.g., 20% greater) than the rest of the layer. Alternatively, the entirety of a layer can be a void with respect to a seal, as discussed below with respect to FIGS. 10A-10B.

In various aspects, layer stack 30 includes first-exposed layer 2C and a plurality of buried layers 2B, 2A arranged between first-exposed layer 2C and substrate 10. Seal 4A is lower in susceptibility to each of the respective environmental factors than the respective layers 2C, 2B, 2A in the layer stack. Seal 4A is arranged so that each buried layer 2B, 2A is permitted to be exposed to the respective environmental factor only through respective void(s) in the one or more layer(s) 2C, 2B farther from substrate 10 than that buried layer 2B, 2A. For example, buried layer 2B is permitted to be exposed to environment 320 only through a void in layer 2C. Buried layer 2A is permitted to be exposed to environment 320 only through respective voids in layers 2C and 2B. Sensor patch 30 is permitted to be exposed to environment 320 only through respective voids in layers 2C, 2B, and 2A. Environment 320 is defined so that layers 2A, 2B, 2C that are permitted to be exposed to the corresponding environmental factor will be exposed to that factor if that factor is present in environment 320. Environment 320 does not include volumes from which environmental factors cannot reach the layers (e.g., layers 2A, 2B, 2C) to which they are susceptible.

In various aspects, electronic sensing system 5 is used to validate operation of processing machinery that exposes items to a series of environmental factors. For example, a machine can expose an item to a series of temperatures and chemicals to process it (e.g., a printed-circuit-board placement machine, which exposes a printed-circuit board to a specific sequence of heat, flux, solder, and heat). Layer stack 3 (or a patch stack, as described below) can include layers (patches) susceptible to those factors in order top to bottom, and electronic sensing system 5 including layer stack 3 (or a patch stack) can be passed through the machine. If the correct sequence is provided, layer stack 3 will burn through and sensor patch 30 will change electrical state to indicate success.

Still referring to FIGS. 1A and 1B, in various aspects, detection circuit 24 includes circuitry, e.g., controller 88, that responds to signals on input pads 14, analyzes the signals to produce information, and temporarily stores the information, e.g., in memory 42, which can be an SRAM. The information is then accessible for transmission by interface 26. Interface 26 reads the temporarily stored information and transmits it as an uplink signal 82 through antenna 28. Controller 88 can also read the stored information and transmit it through interface 26. The information read can be that stored in memory 42. Antenna 28 can be disposed over or attached to substrate 10. Antenna 28 can be substantially coplanar with substrate 10 or protruding or extending therefrom. The information can also be transmitted concurrently with its production by detection circuit 24, so that no temporary storage is required. In various aspects, transceiver 20 is a radio-frequency identification (RFID) transceiver. Transceiver 20 and reader 89 can communicate using standard protocols, such as EPCglobal Class-1 Gen-2 RFID, BLUETOOTH, WIFI, Ethernet, Aloha, or GSM, or custom protocols. The term "transceiver" as used herein includes transponders that respond to queries.

Substrate 10 can be a commercially available substrate, e.g., glass, plastic, or metal. Substrate 10 can be a packaging material, including but not limited to paper, cardboard, wood, plywood, laminates, fiberboard, plastic, or a packaging material coated in polymer. Substrate 10 can be a disposable material and can have formed thereon a planarization layer 11 to facilitate the construction and performance of the code circuit 16. Layer 11 can also seal or smooth substrate 10. A seal 13 (e.g., a spin-coated layer) can be provided over portions of code circuit 16 to protect those portions (e.g., separately-placed discrete components). In various aspects, transceiver 20 is also encapsulated or otherwise sealed against environmental factors to improve its robustness. Commercial methods are known for manufacturing, cutting, shaping, and folding substrate materials, for example for packaging containers.

Transceiver 20 can be an integrated circuit, for example formed on a semiconductor transceiver substrate 21 such as silicon or gallium arsenide and can be crystalline, polycrystalline, or amorphous. Transceiver substrate 21 can be a circuit substrate that includes one or more circuits formed on or in the circuit substrate. Alternatively, transceiver substrate 21 can be formed on a non-semiconductor substrate with a semiconductor coating such as crystalline, polycrystalline, or amorphous semiconductor materials, for example silicon, or include oxide materials such as aluminum oxide, aluminum zinc oxide, or other oxide materials in which thin-film circuits (e.g., thin-film transistors) or passive electrical elements can be formed. Transceiver substrate 21 can be affixed with an adhesive to substrate 10 either as part of planarization layer 11 or as a separate layer (not shown). Transceiver 20 can be formed on a silicon wafer, packaged in a ball-grid array (BGA) package, and placed on a printed-circuit board substrate 10 using an automated pick-and-place machine. The transceiver IC can also be supplied as a bare die, e.g., a known-good die (KGD), and bonded directly to substrate 10. Alternatively, transceiver 20 can be formed on or over substrate 10 by printing semiconductor materials and conductors using various methods known in the art, for example inkjet deposition methods.

Transceiver 20 can include controller 88 to command excitation circuit 22 and detection circuit 24 and to communicate with interface 26. Controller 88 can include a CPU, MPU, FPGA, PLD, PLA, PAL, ASIC, or other logic or processing device. The excitation signal can be produced at regular time intervals, time intervals based on past electrical-state readings, or in response to a reading from a sensor (not shown) connected to controller 88. The excitation signal can also be produced in response to external events, such as human actuation of a user control or the receipt of an external signal (e.g., SYNC). Controller 88 can be connected to, or include, memory 42, which can be volatile or nonvolatile, e.g., RAM, SRAM, DRAM, ROM, Flash, EPROM, or EEPROM. Memory 42 can store access keys, thresholds, or other values; various examples are discussed herein.

Various aspects described herein include layer stacks including multiple layers, patch stacks including multiple sensor patches, or stacks of layers or sensor patches over another sensor patch. Layers and sensor patches can be used in various combinations described herein, so depictions of layers in the figures can also represent sensor patches, and vice versa, unless otherwise stated herein.

Figure 2:
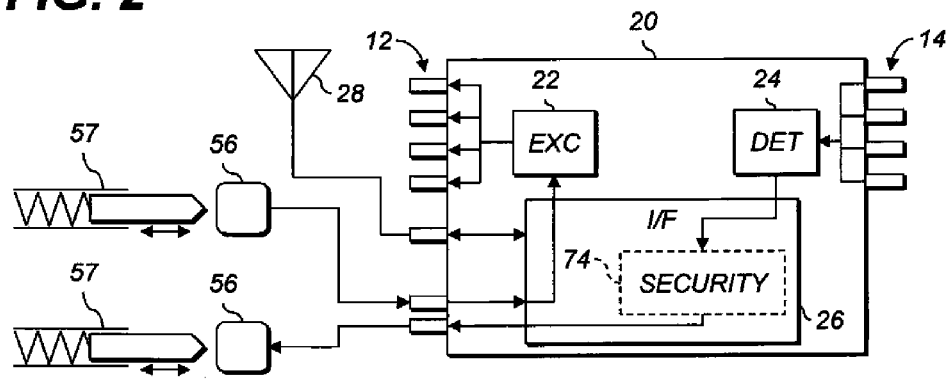
FIG. 2 is a schematic plan of a transceiver packaged in an integrated circuit and related components according to various aspects.

FIG. 2 is a plan of transceiver 20 packaged in an integrated circuit with input and output electrical interconnection pads 14, 12, respectively. Input pads 14, output pads 12, detection circuit 24, and excitation circuit 22 are as shown in FIGS. 1A and 1B.

In various aspects, input pads 14 or output pads 12 are provided as pins, bumps, pads, leads, or other contact types found in integrated circuits of various formats, for example pin-grid arrays, ball-grid arrays, small-outline packages, or thin small-outline packages. Input or output pads 14, 12 provide an externally accessible electrical connection to the circuits in transceiver 20. In various aspects, a single pad serves as an output pad 12 and an input pad 14, either simultaneously or sequentially, as is discussed below.

In various aspects, transceiver 20 includes, or is electrically connected to, one or more electrical connectors 56. Interface 26 communicates with electrical connectors 56. Connectors 56 can be, e.g. pads, sockets, pogo pins, bond wires, or pins, adapted to mechanically contact one or more electrodes 57 separate from the transceiver to form one or more electrical connections between electrical connectors 56 and electrodes 57. In the example shown, electrodes 57 are pogo pins and the electrical connectors are pads. Transceiver 20 can be interrogated through wired readers, probe cards, communications controllers, or other interrogation devices.

In various aspects, transceiver 20 is connected to RF antenna 28, to one plate of a capacitor, or to an inductor. This permits wireless data transfer. In various aspects, interface 26 includes optional security circuit 74 that controls access to information read from code circuit 16. Security circuit 74 includes storage for an enablement signal. If the stored enablement signal is present or has the correct value, interface 26 is permitted to transmit information received from detection circuit 24. If the enablement signal is not present or is incorrect, interface 26 is not permitted to transmit information from detection circuit 24. The enablement signal can be provided electronically or by using software. In an example, a password (or other cryptographic secret) is supplied to security circuit 74 through a computer-mediated graphical user interface or a physical switch. Security circuit 74 compares the received password to a stored secret (e.g., a password or one-time pad key) and sets the enablement signal if the received password and the secret password match. In other aspects, security circuit 74 calculates a cryptographic hash of a known secret password plus salt, a challenge or nonce from reader 89 (FIG. 1A), or both. Security circuit 74 compares the calculated hash with a hash received from reader 89, and enables if the hashes match. Security circuit 74 can include logic or software to perform public- or private-key encryption, block or stream ciphering, key exchange, hashing, compression or decompression, or any combination of those.

Figure 3:
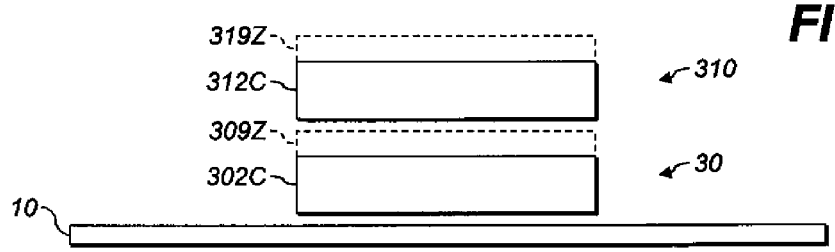
FIG. 3 is an elevational cross-section of sensor patches in a patch stack on substrate according to various aspects.

FIG. 3 is an elevational cross-section of sensor patches 30, 310 in a patch stack on substrate 10 according to various aspects. Substrate 10 and sensor patches 30, 310 are shown spaced apart for clarity. They can be stacked directly on each other. Sensor patch 30 has electrically-conductive layer 302C that is susceptible to the corresponding environmental factor, and optional electrically-insulating layer 309Z. Sensor patch 310 has electrically-conductive layer 312C and optional electrically-insulating layer 319Z. In an example, since layers 302C, 312C are susceptible to respective environmental factors, sensor patches 30, 310 changes electrical state (e.g., impedance) when exposed to the respective environmental factor.

Optional electrically-insulating layer 309Z is arranged between electrically-conductive layer 302 of sensor patch 30 and electrically-conductive layer 312C of adjacent second sensor patch 310 in a stack of sensor patches. Layer 309Z electrically insulates conductive layers 302C, 312C from each other. Electrically-insulating layer 309Z is susceptible to the corresponding environmental factor of sensor patch 30. Electrically-insulating layer 319Z, likewise, insulates layer 312C from a layer in a sensor patch (not shown) above patch 310. Electrically-insulating layer 319Z is susceptible to the corresponding environmental factor of sensor patch 310. Patches 30, 310 can be susceptible to the same environmental factor or different environmental factors. In aspects using a patch stack, each patch in the stack can be susceptible to a respective environmental factor. The layers can be the same size or different sizes, in any combination. FIG. 3 shows electrically-conductive layers 302C, 312C. Electrically-insulating layers can also be used, e.g., as discussed below with reference to FIGS. 4A-4B.

Sensor patches 30, 310, and layers 302C, 309Z, 312C, 319Z therein, can be formed in a variety of ways. In various aspects, conductive inks are pattern-wise applied to the substrate 10 and connected to the input and output pads 14, 12 (FIG. 2). This can be done using, e.g., an inkjet printer or printhead or a flexographic or gravure printer. Sensor patch 30 can include conductive particles and non-conductive binder particles. Non-conductive particles can be removed or set using chemical methods or exposure to radiation (e.g., ultraviolet light). Patterned conductive inks can thus be cured to form code circuit 16 (FIG. 1B) including sensor patch 30. Sensor patch 30 includes conductive wires, resistors, capacitors, inductors, or other passive electrical devices that store information in code circuit 16 to be retrieved when code circuit 16 is queried with an excitation signal.

Figure 4A:
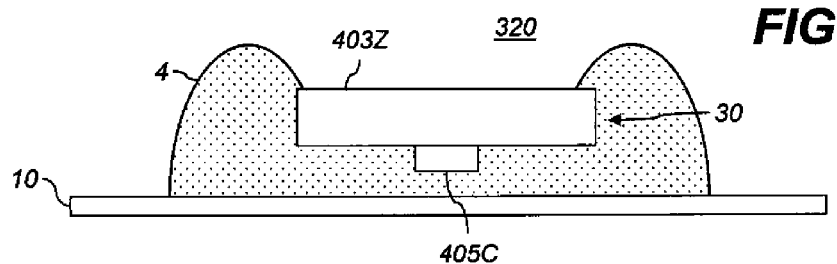
FIG. 4A is an elevational cross-section, and FIG. 4B a plan, of a sensor patch according to various aspects.
Figure 4B:
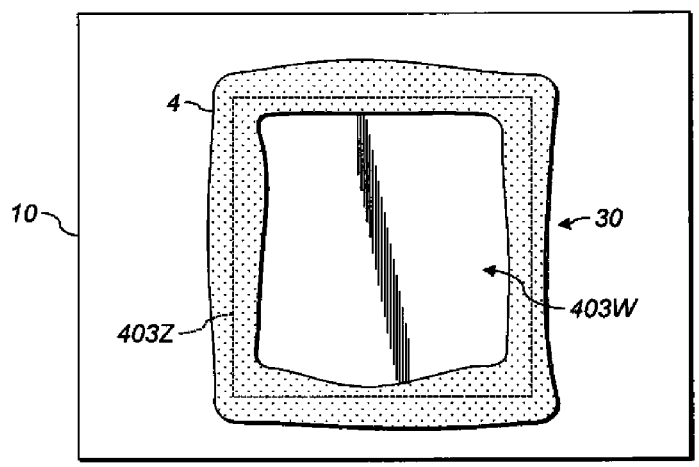

FIG. 4A is an elevational cross-section of sensor patch 30 according to various aspects. FIG. 4B is a plan of sensor patch 30. Seal 4 and environment 320 are as discussed above with reference to FIG. 1A. Sensor patch 30 has electrically-insulating layer 403Z that is susceptible to the corresponding environmental factor, and conductor 405C. Conductor 405C is arranged on the side of layer 403Z closer to substrate 10. Conductor 405C can be disposed over or embedded within layer 403Z, or can protrude therefrom. Layer 403Z and conductor 405C can be the same size or different sizes.

As shown, in these aspects, seal 4 wraps around the edges of layer 403Z and covers a small area of the top of layer 403Z. As a result, the environmental factor in environment 320 cannot contact or act on layer 403Z through seal 4. The environmental factor therefore cannot contact or act on conductor 405C until layer 403Z burns through. As shown in FIG. 4B, seal 4 leaves window 403W open. Window 403W is an opening through which the environmental factor can contact or act on the top surface of layer 403Z.

In various aspects, conductor 405C is susceptible to the same environmental factor as layer 403Z. Therefore, after layer 403Z burns through, conductor 405C will burn through if exposure to the environmental factor continues.

In other aspects, layer 403Z is susceptible to a first environmental factor. Conductor 405C is susceptible to a second environmental factor different from the first environmental factor. After layer 403Z burns through from exposure to the first environmental factor, conductor 405C will burn through only if the second environmental factor is present. For example, calcium is conductive, but reacts with water to form CaO and Ca(OH)$_2$, both of which are non-conductive. If water vapor is the second environmental factor and is always present in environment 320, the material of layer 403Z can be selected to be susceptible to a first environmental factor without regard to the electrical properties of that material. Conductor 405C will burn through once the first environmental factor has burned through layer 403Z. This permits inexpensively detecting environmental factors that do not significantly affect electrical properties, e.g., elevated temperatures within ranges at which conductor 405C is a low-resistivity solid. In another example, this permits detecting low levels of moisture (first environmental factor) in an environment corrosive to metals (second environmental factor). Layer 403Z protects conductor 405C from premature corrosion.

Figure 5:
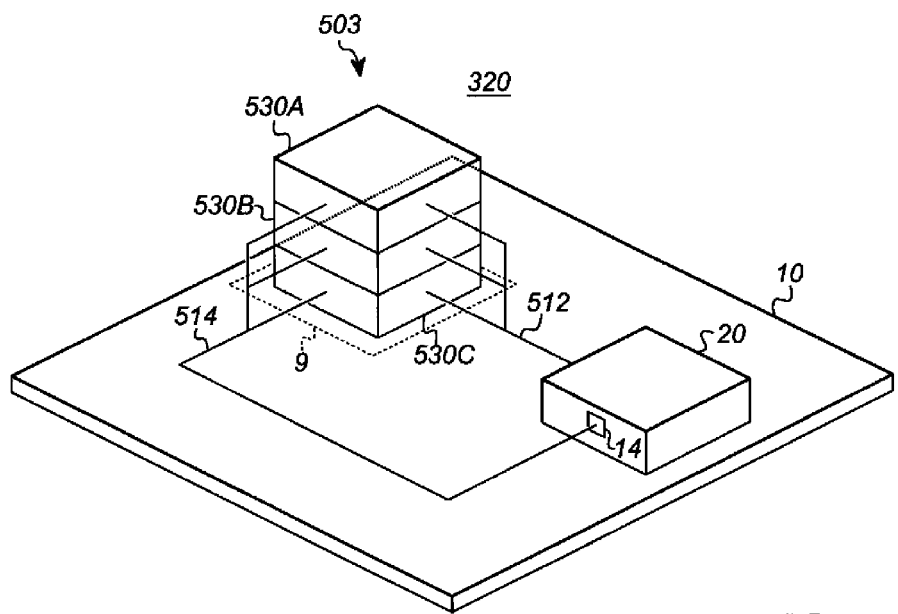
FIG. 5 is an isometric view of an electronic sensing system according to various aspects.

FIG. 5 is an isometric view of an electronic sensing system according to various aspects. Substrate 10 has detection region 9, as discussed above with respect to FIG. 1B.

Transceiver 20 is formed on transceiver substrate 21 (FIG. 1A) separate from substrate 10 and affixed to substrate 10. Transceiver 20 includes an output electrical-connection pad, an excitation circuit adapted to provide an excitation signal to the output pad, an input electrical-connection pad, a detection circuit connected to the input pad, and an interface responsive to a downlink signal to transmit an uplink signal representing the electrical state of the input pad, as shown in FIGS. 1A, 1B, and 2. Input electrical-connection pad 14 is shown in this figure. In various aspects, code circuit 16 (FIG. 1B) electrically connects output electrical-connection pad 12 (FIG. 1B) to input electrical-connection pad 14 through sensor patches 530A, 530B, 530C. That is, output electrical-connection pad 12 is electrically connected to input electrical-connection pad 14 through the plurality of sensor patches 530A, 530B, 530C.

Patch stack 503 is disposed over substrate 10 at least partly in detection region 9. Patch stack 503 includes a plurality of electrically-conductive sensor patches 530A, 530B, 530C in a selected order. Each sensor patch 530A, 530B, 530C has a conductance susceptible to a respective environmental factor. The conductances can be susceptible to the same environmental factor or to different environmental factors, in any combination, and the magnitude of susceptibility can be the same or different for each sensor patch 530A, 530B, 530C, in any combination. Conductance of a sensor patch 530A, 530B, 530C can change because the electrical conductivity, size, or shape of the sensor patch changes. In an aspect, sensor patches 530A, 530B, 530C can be spatially distributed over substrate 10 rather than vertically stacked. In this configuration, the same environmental factor 320 can affect a plurality of, or all of, the sensor patches 530A, 530B, 530C at the same time. In such an aspect, the sensor patches 530A, 530B, 530C can have different susceptibilities to environmental factors in environment 320. This is discussed further below with respect to FIG. 7.

The output electrical-connection pad of transceiver 20 is electrically connected to the input electrical-connection pad through some or all of the sensor patches 530A, 530B, 530C in parallel electrically. The detection circuit in transceiver 20 therefore detects an electrical state of the input pad in response to the excitation signal and the respective conductances of the sensor patches. In the example shown, sensor patches 530A, 530B, 530C are electrically connected to transceiver 20 through conductors 512, 514. Sensor patches 530A, 530B, 530C function as resistors wired in parallel, so as each is affected by the environmental factor in environment 320, the parallel resistance seen by transceiver 20 across conductors 512, 514 changes. Transceiver 20 detects this change and determines that environment 320 contains a factor to which at least one of the sensor patches 530A, 530B, 530C is susceptible.

Sensor patches 530A, 530B, 530C can be electrically isolated from each other but wired in parallel, as shown here. Sensor patches 530A, 530B, 530C can also be electrically connected at the surfaces where they interface to form a single resistive element. The resistance of this element will vary as the conductance of each sensor patch 530A, 530B, 530C changes. The parallel-wiring configuration and single-resistor configuration have similar conductances but different electrical parasitics and mechanical structures. These configurations also respond differently to exposure of faces of sensor patches 530A, 530B, 530C to environment 320.

Still referring to FIG. 5, and also referring back to FIG. 1, in various aspects, the electrical state of input electrical-connection pad 14 represents a detected resistance (DC impedance) of sensor patches 530A, 530B, 530C wired in parallel. Transceiver 20 further includes a controller (controller 88, FIG. 1A) and a memory (memory 42, FIG. 1A) storing a plurality of thresholds. Controller 88 compares the detected resistance to one or more of the thresholds. Controller 88 automatically transmits uplink signal 82 (FIG. 1) whenever the detected resistance crosses one of the thresholds. In various aspects, controller 88 periodically measures the detected resistance and stores the result in memory. If the next reading differs from the previous reading by more than a selected amount, controller 88 transmits uplink signal 82.

Figure 6:
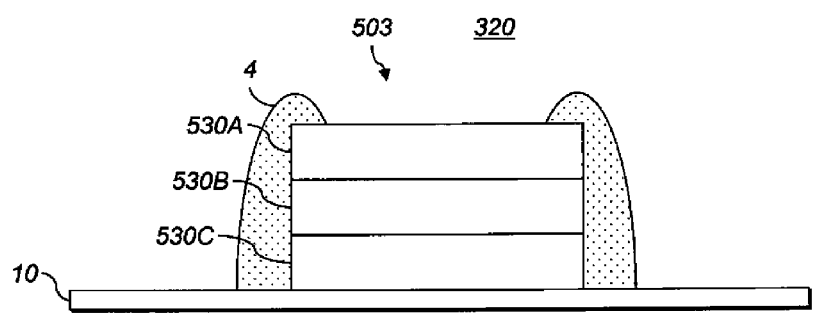
FIG. 6 is an elevational cross-section of portions of an electronic sensing system according to various aspects.

FIG. 6 is an elevational cross-section of an electronic sensing system according to various aspects. Substrate 10, environment 320, patch stack 503, and sensor patches 530A, 530B, 530C are as discussed above with reference to FIG. 5. Seal 4 is as discussed above with reference to FIGS. 4A and 4B. Seal 4 is arranged so that the environmental factor affects sensor patch 530A, then 530B, then 530C as each higher-up patch burns through.

Specifically, patch stack 503 includes first-exposed sensor patch 530A and a plurality of buried sensor patches 530B, 530C. Buried sensor patches 530B, 530C, of which there can be any number, are arranged between first-exposed sensor patch 530A and substrate 10. Seal 4 is lower in susceptibility to each of the respective environmental factors than the respective sensor patches 530A, 530B, 530C in the patch stack. Seal 4 is arranged so that each buried sensor patch 530B, 530C is permitted to be exposed to the respective environmental factor only through a void in one or more sensor patches 530A, 530B farther from the substrate than that buried sensor patch 530B, 530C. In this example, sensor patch 530B is permitted to be exposed to environment 320 only after sensor patch 530A burns through. Sensor patch 530C is permitted to be exposed to environment 320 only after sensor patches 530A and 530B burn through. In this way, the resistance of the parallel combination of sensor patches 530A, 530B, 530C can change gradually as burn-through occurs.

Figure 7:
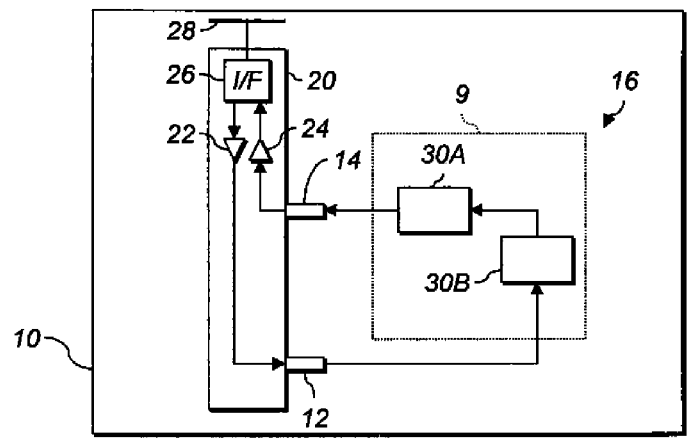
FIGS. 7 and 8 are schematics of electronic sensing systems according to various aspects.

FIG. 7 is a plan of an electronic sensing system according to various aspects. Antenna 28 and substrate 10 with detection region 9 are as discussed above with respect to FIG. 1B.

Transceiver 20 is formed on a transceiver substrate separate from the substrate and affixed to the substrate, as described above with reference to FIG. 1A. Transceiver 20 includes output electrical-connection pad 12, excitation circuit 22 adapted to provide an excitation signal to output pad 12, input electrical-connection pad 14, detection circuit 24 connected to the input pad, and interface 26 responsive to a downlink signal to transmit an uplink signal representing the electrical state of input pad 14.

Code circuit 16 includes a plurality of electrically-conductive sensor patches 30A, 30B disposed over substrate 10, each sensor patch 30A, 30B disposed at least partly in detection region 9. Each sensor patch 30A, 30B has a conductance susceptible to a respective environmental factor.

Sensor patches 30A, 30B are distributed over substrate 10 so that they are exposed to an external environmental factor substantially contemporaneously. For example, the sensor patches 30A, 30B can be next to each other and not separated by baffles or other barriers so that if substrate 10 is dipped in water, all the sensor patches 30A, 30B will be moistened at substantially the same time. Sensor patches 30A, 30B can partially overlap each other.

Output pad 12 is electrically connected to input pad 14 through sensor patches 30A, 30B in series. Detection circuit 24 thus detects an electrical state of input pad 14 in response to the excitation signal and the respective conductances of sensor patches 30A, 30B. This permits detecting any of several environmental factors to which detection region 9 can be exposed. In the example shown, two sensor patches 30A, 30B are connected in series, and each is susceptible to a respective, different environmental factor. Exposure to either of the respective, different environmental factors will change the conductance of the series combination of the two sensor patches 30A, 30B. This permits transceiver 20 to detect either factor and report that one of the factors is present. In an example, a plurality of sensor patches 30A, 30B can be used to detect the following, respectively: temperatures below 0° C.; temperatures above 35° C., high concentrations of methane, high concentrations of corrosive agents, and submersion. The system thus configured can give warning of any of those potentially-hazardous conditions.

In various aspects, a patch stack (not shown) is used in place of one of the sensor patches 30A, 30B, or in addition to the sensor patches 30A, 30B, or any combination. A layer stack together with a conductor can also be used instead of, or in addition to, a patch stack. A patch stack can have sensor patches electrically connected in parallel (e.g., as shown in FIG. 5). A layer stack can have a single conductor under multiple layers (e.g., as shown in FIGS. 3 and 4A). In an example, a patch stack is used in place of sensor patch 30B. Controller 88 (FIG. 1A) will detect a significant change in resistance (e.g., an open) if sensor patch 30A burns through or if the patches in the patch stack burn through in sequence. This permits detecting any one of a set of conditions, each condition being either exposure to a single environmental factor or exposure to a sequence of environmental factors.

Figure 8:
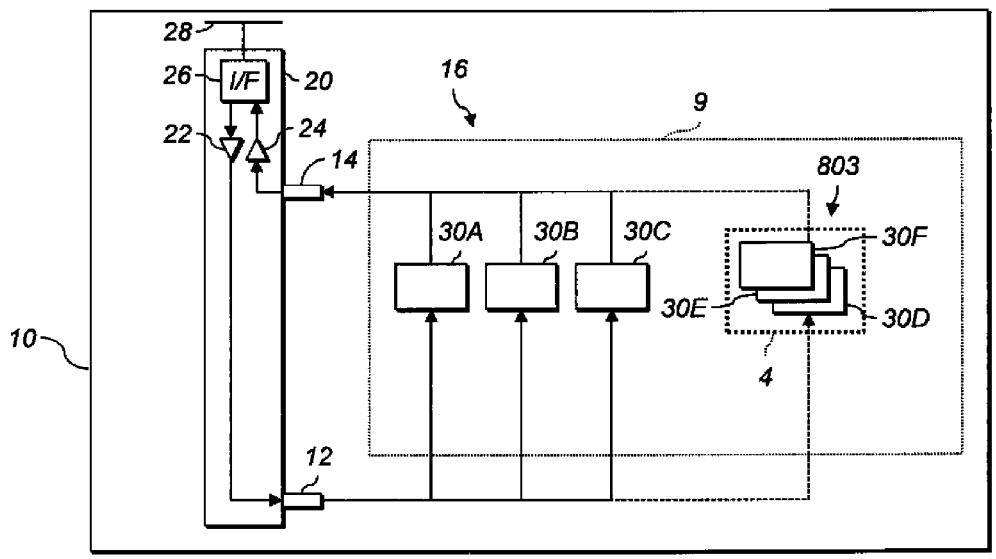

FIG. 8 is a plan of an electronic sensing system according to various aspects. Antenna 28 and substrate 10 with detection region 9 are as discussed above with respect to FIG. 1B. Transceiver 20, interface 26, output electrical-connection pad 12, and input electrical-connection pad 14 are as shown in FIG. 7.

Excitation circuit 22 provides an excitation signal to output pad 12. Electrically-conductive sensor patches 30A, 30B are disposed over the substrate as described above with reference to FIG. 7. Output pad 12 is electrically connected to input pad 14 through sensor patches 30A, 30B in parallel, so that detection circuit 24 detects an electrical state of input pad 14 in response to the excitation signal and the respective conductances of the sensor patches 30A, 30B.

In various examples related to FIG. 7, a strong signal (significant change in resistance) is produced for exposure to any of the environmental factors to which the sensor patches 30A, 30B are susceptible. Various examples related to FIG. 8 can produce a weaker signal for a single burn-through, but can determine which of the environmental factors the system has been exposed to. In various examples related to FIG. 8, each sensor patch 30A, 30B has a respective, different electrical resistance. The respective electrical resistances of the sensor patches can form a logarithmic or exponential series. For example, the sensor patches can have resistances of 10Ω, 100Ω, and 1000Ω ($10^2$-$10^4$), for a parallel resistance of approximately 9Ω. If the 10Ω sensor patch burns through and opens, the resistance of the parallel combination jumps to approximately 91 ohms (~10× change). If the 100Ω patch opens, the parallel resistance changes to approximately 10Ω (~11% change). If the 1000Ω patch opens, the parallel resistance changes to approximately 9.1Ω (~1% change).

In another example, three patches can have resistances of 16Ω, 32Ω, and 64Ω ($2^4$-$2^6$). The parallel combinations are given in Table 1, below. R1, R2, and R3 are the three resistance values, or "open" for sensor patches 30A, 30B that have burned through and are no longer electrically conductive (e.g., >1 MΩ or >10 MΩ, or ∞Ω). (Patches 30A, 30B that have only partly burned through will have finite resistances that contribute to the parallel combination.) Rpar is the resulting parallel combination, and Δ is the percentage difference between each row and the first row (all three patches 30A, 30B conducting).

TABLE 1 resistance example

| R1 | R2 | R3 | Rpar | Δ |
|---|---|---|---|---|
| 16 | 32 | 64 | 9.14 | N/A |
| open | 32 | 64 | 21.33 | 133% |
| 16 | open | 64 | 12.80 | 40% |
| 16 | 32 | open | 10.67 | 17% |
| open | open | 64 | 64.00 | 600% |
| 16 | open | open | 16.00 | 75% |
| open | 32 | open | 32.00 | 250% |
| open | open | open | ∞ | ∞ |

The various Rpar values are far enough apart to be readily distinguishable using measurement techniques discussed above. Other values of Rn can be used, e.g., values that do not form a regular sequence.

Still referring to FIG. 8, in various aspects, combinations of stacks (either patch stacks or layer stacks) and individual patches are used. In the example shown, patch stack 803 includes sensor patches 30D, 30E, and 30F stacked vertically, optionally sealed by seal 4. Sensor patches 30A, 30B, 30C are shown offset in FIG. 8 so they are all visible. However, they are all in fact stacked vertically, e.g., as shown in FIGS. 5 and 6 (although some overlap or offset is permissible). Moreover, as shown in FIG. 5, sensor patches 530A, 530B, 530C are electrically connected in parallel. In this way, controller 88 (FIG. 1A) detects a change in resistance (e.g., per Table 1) when any of several conditions occurs. Each condition can be either exposure to a single environmental factor (sensor patches 30A, 30B, or 30C and their respective environmental factors) or exposure to a sequence of environmental factors (patch stack 803 detecting the sequence of exposure to environmental factors to which sensor patches 30F, 30E, 30D are susceptible, in that order).

In various examples, memory 42 (FIG. 1A) is used, as described above with reference to FIG. 7. The electrical state of input electrical-connection pad 14 represents a detected resistance of the sensor patches wired in parallel. The controller compares the detected resistance to one or more stored thresholds and automatically transmits the uplink signal whenever the detected resistance crosses one of the thresholds, or whenever the difference between previous and current reading crosses one of the thresholds.

Figure 9:
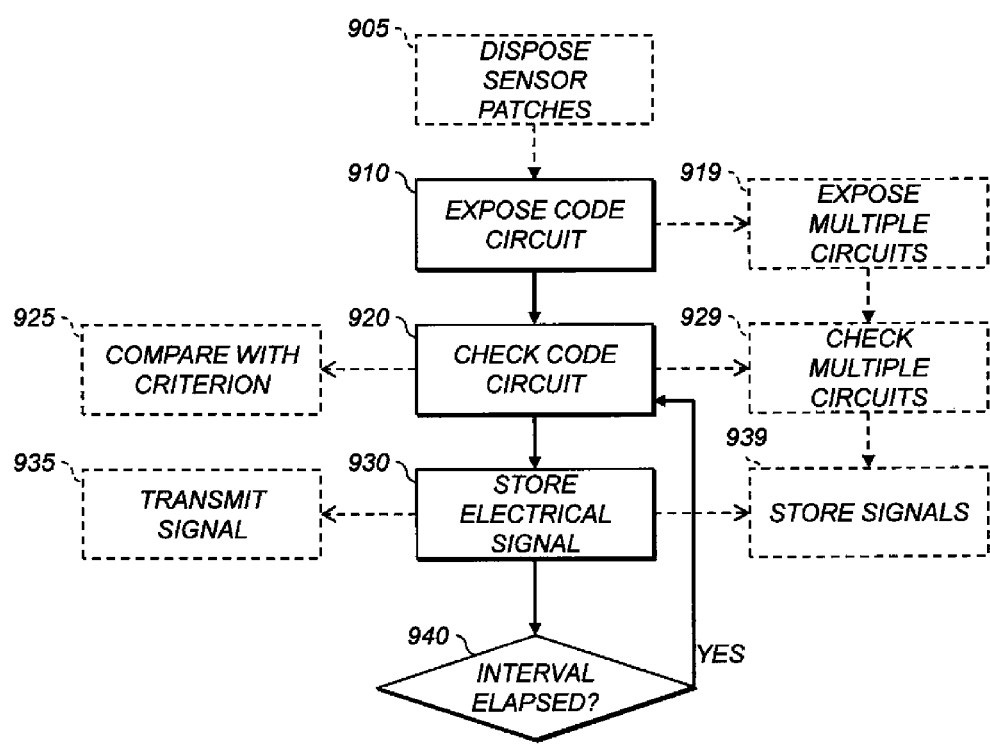
FIG. 9 shows methods of sensing exposure to one or more of a plurality of environmental factors.

FIG. 9 shows methods of sensing exposure to one or more of a plurality of environmental factors. Processing begins with optional step 905 or step 910. An arrow with a triangular arrowhead connects a step to a step that can follow it. An arrow with an open arrowhead connects a step to a substep that step can include.

In optional step 905, before exposing step 910, the sensor patches of the code circuit (discussed below) are disposed over the substrate by depositing respective conductors and printing respective susceptible layers over the conductors. Each susceptible layer is susceptible to a corresponding one of the one or more environmental factors. The conductors and susceptible layers can be deposited or printed using a printer, e.g., an inkjet or electrophotographic printer. Optional step 905 is followed by step 910.

In step 910, a code circuit is exposed to at least some of the environmental factors. The code circuit is disposed over a substrate and includes a plurality of sensor patches, which are electrically connected in various aspects. Each patch has a respective, specific lateral extent, and is susceptible to one or more of the environmental factors. That is, each sensor patch has a respective electrical state that changes with exposure to one or more corresponding one(s) of the one or more environmental factors. The code circuit has an electrical state, as discussed above, related to the electrical states of the sensor patches and their electrical connections to each other and to input and output electrical-connection pads. In various aspects, at least one of the respective electrical states of the sensor patches changes from high conductivity to low conductivity with exposure to the environmental factor. In other aspects, the change is from low conductivity to high conductivity. Various examples of sensor patches, layers, patch stacks, and layer stacks on patches are given herein and can be used with various aspects of this method.

In various aspects, the sensor patches are arranged in a patch stack including a first-exposed one of the sensor patches and one or more buried ones of the sensor patches arranged between the first-exposed sensor patch and the substrate. The code circuit includes a seal lower in susceptibility to each of the respective environmental factors than the respective sensor patches in the patch stack. The seal is arranged so that each buried sensor patch is permitted to be exposed to the respective environmental factor only through a void in one or more sensor patches farther from the substrate than the buried sensor patch.

In various aspects, patch stacks (or layer stacks on a sensor patch), seals, and cavities are used as described below with reference to FIGS. 10A-10B. In these aspects, as described below, exposing a first-exposed sensor patch to the corresponding environmental factor causes the first-exposed sensor patch to become fluid. At least some of the resulting liquid or gas then travels substantially according to a flow pattern into the cavity to permit a second-exposed sensor patch to be exposed to the corresponding environmental factor. Flow patterns are discussed below with respect to FIG. 11. In various aspects, burn-through of a first-exposed sensor patch develops a void therein through which a second-exposed sensor patch is permitted to be exposed to the respective environmental factor.

In various aspects, the sensor patches are electrically connected in parallel. In other aspects, the sensor patches are electrically connected in series. In various aspects, the sensor patches are distributed (and can optionally overlap somewhat) over the substrate so that they are exposed to an external environmental factor substantially contemporaneously. Step 910 is followed by step 920 and can include optional step 919.

In optional step 919, which is part of step 910, a plurality of code circuits are contemporaneously exposed to the at least some of the one or more environmental factors. Each code circuit is disposed over the substrate and includes a respective plurality of electrically-connected sensor patches. Each sensor patch is susceptible to one of the one or more environmental factors. Each code circuit has a respective electrical state.

In various aspects, a first of the code circuits includes respective sensor patches that are susceptible to a first subset of the plurality of environmental factors and a second of the code circuits includes respective sensor patches that are susceptible to a second subset of the plurality of environmental factors different from the first subset. In this way, each code circuit performs different tests. Optional step 919 is followed by optional step 929.

In step 920, which is a checking step, an electrical excitation signal is passed through the code circuit, and a corresponding received electrical signal is detected. This is done using a transceiver formed on a transceiver substrate separate from and disposed over the substrate. The transceiver includes a controller, as discussed above. The received electrical signal depends on the excitation signal and the electrical state of the code circuit. Step 920 is followed by step 930 and can include optional step 925 or optional step 929.

In optional step 925, which is part of step 920, the controller automatically compares the received electrical signal with a selected criterion. If the signal corresponds to the criterion, the controller activates an actuator. The criterion can be that an event happened or did not happen, as indicated by the received electrical signal, or that the received electrical signal crossed a threshold or entered a certain range, or other digital or analog criteria or combinations thereof. In an example, the actuator is adapted to dispense a drug when activated. For example, the actuator can dispense the drug into the gastrointestinal tract or circulatory system of a human or animal.

In optional step 929, which is part of step 920, a respective electrical excitation signal is passed through each code circuit. A respective received electrical signal is detected for each code circuit. Optional step 929 is followed by optional step 939.

In step 930, using the controller, the received electrical signal or a representation thereof is automatically stored in a memory. Step 930 is followed by decision step 940 and can include optional step 935 or optional step 939.

In optional step 935, which is part of step 930, the controller receives a downlink signal and, in response, transmits an uplink signal representing the stored received electrical signal(s) or representation(s) thereof. This is represented graphically as following step 930 but can happen at any time.

In optional step 939, which is part of step 930, using the controller, the respective received electrical signals or respective representations thereof, in any combination, are automatically stored in the memory.

Decision step 940 decides whether a selected time interval has elapsed. If so, the next step is step 920. In this way, the controller is used to automatically repeat the checking and storing steps after one or more selected time intervals.

According to various aspects, an electronic sensing system includes a substrate with a detection region. A transceiver formed on a transceiver substrate separate from the substrate is affixed to the substrate. The transceiver has one or more output electrical-connection pad(s), an excitation circuit adapted to provide an excitation signal to the output pad(s), one or more input electrical-connection pad(s), and a detection circuit (which can have multiple inputs) connected to the input pad(s). A code circuit separate from the transceiver is disposed over the substrate at least partially in the detection region. The code circuit has a plurality of conductors and a plurality of electrically-insulating layers. The conductors and layers are arranged to form a layer stack. Each layer is susceptible to a respective environmental factor, so that the conductors change respective electrical states in response to exposure of the layer stack to the respective environmental factors. Not all factors necessarily affect all conductors. Each conductor is electrically connected to one of the output pad(s) and one of the input pad(s). The detection circuit detects an electrical state of each of the input pad(s) in response to the excitation signal and the electrical state of the connected conductor(s). The transceiver includes an interface responsive to a downlink signal to transmit an uplink signal representing the electrical state(s) of the input pad(s).

According to various aspects, an electronic sensing system includes a substrate with a detection region. A transceiver formed on a transceiver substrate separate from the substrate is affixed to the substrate. The transceiver has an output electrical-connection pad, an excitation circuit adapted to provide an excitation signal to the output pad, an input electrical-connection pad, and a detection circuit connected to the input pad. A code circuit separate from the transceiver is disposed over the substrate at least partially in the detection region. The code circuit includes a conductor and a plurality of electrically-insulating layers disposed over or under (or each at different points) the conductor. Each layer is susceptible to a respective environmental factor, so that the conductor changes electrical state in response to exposure of any of the layers to the respective environmental factors. The layers are distributed (and can partially overlap) over the substrate so that they are exposed to an external environmental factor substantially contemporaneously. The conductor is electrically connected to the output pad and the input pad so that the detection circuit detects an electrical state of the input pad in response to the excitation signal and the electrical state of the conductor. The transceiver further includes an interface responsive to a downlink signal to transmit an uplink signal representing the electrical state(s) of the input pad(s).

According to various aspects, an electronic sensing system includes a substrate with a detection region. A transceiver formed on a transceiver substrate separate from the substrate is affixed to the substrate, the transceiver including an output electrical-connection pad, an excitation circuit adapted to provide an excitation signal to the output pad, an input electrical-connection pad, a detection circuit connected to the input pad. A code circuit separate from the transceiver is disposed over the substrate at least partially in the detection region, the code circuit including a plurality of conductors and a corresponding plurality of electrically-insulating layers disposed over or under corresponding conductors. The conductors and layers do not have to be in 1-to-1 relationship; one conductor can be connected to one or more layers, or one layer can be connected to one or more conductors, or any combination. Each layer is susceptible to a respective environmental factor, so that each conductor changes respective electrical state in response to exposure of a corresponding one of the layers to the respective environmental factor. The conductors are connected in parallel between the output pad and the input pad. The detection circuit detects an electrical state of the input pad in response to the excitation signal and the electrical state of the connected conductors. The transceiver further includes an interface responsive to a downlink signal to transmit an uplink signal representing the electrical state of the input pad. In various examples, the resistances of various of the conductors or layers are different from each other.

Figure 10A:
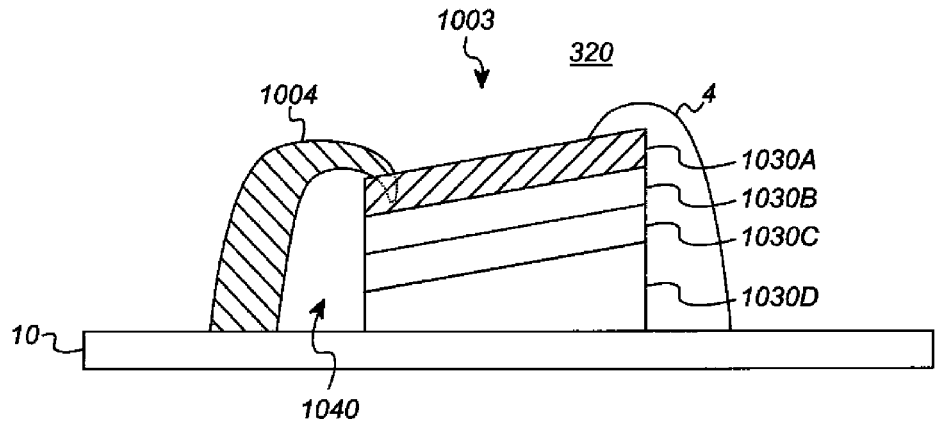
FIGS. 10A and 10B are elevational cross-sections of portions of electronic sensing systems according to various aspects.
Figure 10B:
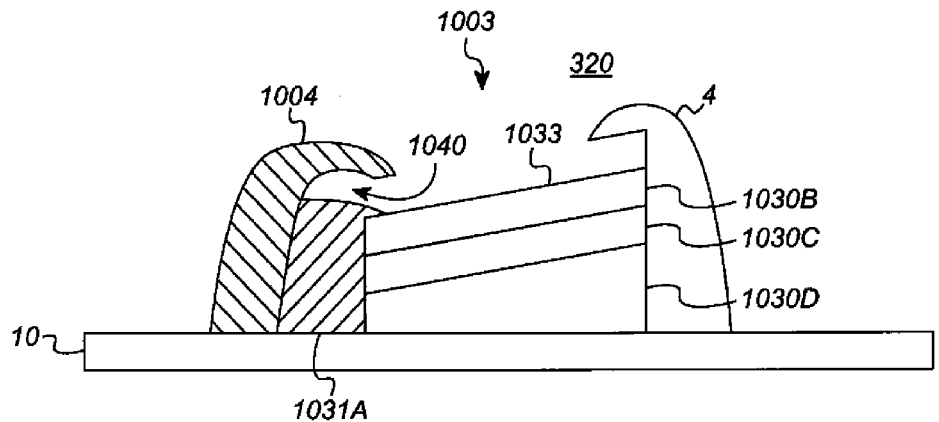

FIGS. 10A and 10B are elevational cross-sections of portions of electronic sensing systems according to various aspects. Seal 4, substrate 10, and environment 320 are as discussed above with reference to FIG. 6. In the discussion of FIGS. 10A and 10B, layers and layer stacks are referred to. These can also be sensor patches and sensor patch stacks, e.g., as described above with reference to FIG. 5. Layer 1030A, which can be a sensor patch, can be conductive or non-conductive.

Seal 1004 is a seal similar to seal 4, or a portion of seal 4. Seals 4, 1004 are labeled differently for clarity of reference in this discussion. Seals 4, 1004 are lower in susceptibility to the respective environmental factors of layers 1030A, 1030B than layers 1030A, 1030B, respectively.

In various aspects, only a sensor patch and a single layer are used. Layers 1030B, 1030C are not present, and layer 1030A is adjacent to sensor patch 1030D. Seals 4, 1004 are arranged so that the sensor patch (e.g., layer 1030D) is permitted to be exposed to the respective environmental factor only through a void in first layer 1030A.

In various aspects, layer stack 1003 includes first-exposed layer 1030A and second-exposed layer 1030B arranged between first-exposed layer 1030A and sensor patch 1030D and adjacent to first-exposed sensor patch 1030A. Seals 4, 1004 are lower in susceptibility to the respective environmental factors of sensor patch 1030D, first-exposed layer 1030A, and second-exposed layer 1030B than sensor patch 1030D, first-exposed layer 1030A, and second-exposed layer 1030B, respectively. Seals 4, 1004 are arranged so that second-exposed layer 1030B is permitted to be exposed to the respective environmental factor only through a void in one or more layers 1030A farther from substrate 10 than layer 1030B. In various aspects, layer stack 1003 includes one or more buried layers 1030C (or sensor patches) arranged between sensor patch 1030D and second-exposed layer 1030B, and the seal is lower in susceptibility than each buried layer 1030C (or sensor patch) to the respective environmental factor of that layer (here, layer 1030C).

Regardless of the number or configuration of layers or sensor patches, seal 4 and first layer 1030A (which can be a sensor patch) are arranged to define cavity 1040 between them. Cavity 1040 is sealed off from the environmental factor of second layer 1030D (or sensor patch 1030D), and the environmental factors of other layers or patches in layer stack 1003 (e.g., layer 1030C, sensor patch 1030D) by seal 1004 and first layer 1030A. In the example shown, seal 1004 arches over cavity 1040 and contacts first layer 1030A to seal cavity 1040. Although not shown in this cross-section, seal 1004 is shaped so that it, the layers in layer stack 1003, and optionally substrate 10 together enclose cavity 1040.

Second layer 1030B (or second-exposed layer 1030B, or sensor patch 1030D, or another layer or patch) has flow surface 1033 (FIG. 10B) adjacent to first-exposed layer 1030A (FIG. 10A). Flow surface 1033 has a shape, orientation, or composition that defines a flow pattern. The flow surface can be substantially non-flat, or non-horizontal, in whole or in part. In this example, flow surface 1033 is tilted, and the flow pattern is downhill to the left. Flow surfaces and flow patterns are discussed below with respect to FIG. 11.

First layer 1030A is made fluid (e.g., melted or otherwise liquefied into a liquid, or evaporated or caused to sublimate into a gas) by exposure to the corresponding environmental factor. When first layer 1030A becomes fluid, at least some of the resulting fluid travels substantially along flow surface 1033 into cavity 1040, following the flow pattern. For example, the fluid can travel into the cavity under the influence of gravity. In an example, environment 320 is a gaseous environment, e.g., the atmosphere of the Earth. First layer 1030A can become fluid, resulting in a liquid. First layer 1030A can also become fluid, resulting in a gas denser than the gas or gasses in environment 320, whether due to temperature, composition, or other factors.

First layer 1030A's becoming fluid permits second layer 1030B to be exposed to the corresponding environmental factor (in general, layer 1030B is exposed to environment 320 and any environmental factors therein). In the example shown, layer 1030A is susceptible to heat. When layer 1030A melts, it flows down inclined flow surface 1033 of second layer 1030B into cavity 1040 as mass 1031A. This permits detecting exposure to heat and subsequent exposure to a chemical. In various aspects, the fluid of first layer 1030A travels into cavity 1040 under the influence of surface tension or the surface wetting properties of flow surface 1033. For example, flow surface 1033 can be a surface layer 1030A does not wet, and seal 1004 can be covered at least in part with a material that layer 1030A does wet. When layer 1030A becomes fluid, it will pull away from flow surface 1033 and collect on seal 1004.

In various aspects, cavity 1040 is shaped so that when mass 1031A (the fluid from layer 1030A) drains into cavity 1040, it fills cavity 1040 up to or partially over (as shown) second layer 1030B. In this way, mass 1030A maintains the seal, substantially preventing layers 1030C, 1030D from being exposed to environment 320. When FIGS. 10A and 10B are viewed at the same scale (e.g., by magnifying so that seal 1004 is the same size on both figures), layer 1030A and mass 1031A have substantially the same area. Those equal areas are a graphical representation of the fact that, in various aspects, if mass 1031A is at the same temperature as layer 1030A, mass 1031A will have the same volume as layer 1030A (in various aspects, e.g., if mass 1031A cools below its melting temperature). In other aspects, layer 1030A undergoes a non-reversible volume change when it becomes fluid.

In various aspects, seal 1004 is shaped or oriented to reduce environmental ingress while layer 1030A becomes fluid. In an example, seal 1004 protrudes into layer 1030A, leaving only a narrow gap between seal 1004 and second layer 1030B. This is shown by the dotted outline at the end of seal 1004 in FIG. 10A. As layer 1030A becomes fluid, the force of gravity pulls fluid layer 1030A through the gap, displacing air that bubbles out through the gap. In this way, either the gap is substantially environment-impermeable, or the gap is under positive pressure out of cavity 1040, while fluid layer 1030A drains into cavity 1040. This reduces the extent to which any environmental factors from environment 320 can enter cavity 1040 until mass 1030A has sealed layers 1030B, 1030C, 1030D.

In various aspects, cavity 1040 includes a desiccant, getter, or other material that absorbs, adsorbs, or otherwise retains mass 1031A. In various aspects, the sensing system includes fixed elements not susceptible to the corresponding environmental factors of layers 1030A, 1030B, 1030C, 1030D, e.g., vanes or chutes, that direct, collect, or transport fluid from layer 1030A.

In various aspects, first layer 1030A and second layer 1030B are susceptible to heat (e.g., have respective melting points). Layers 1030A, 1030B have respective selected thermal conductances, which depend on the geometry and composition of the layers 1030A, 1030B, respectively. The thermal conductance of layer 1030A is greater than a thermal conductance of seal 1004. In this way, heat energy primarily reaches layer 1030B only through layer 1030A. In these aspects, layer 1030A is considered a void with respect to layer 1030B and seal 1004 once layer 1030A becomes fluid at least in part, or reaches its melting or boiling temperature (at least in part), or once the rate of heat transfer between layer 1030A and layer 1030B reaches a selected level, or once layer 1030B reaches a selected temperature. The level can be, e.g., when layer 1030B is increasing 1° C. per minute. The temperature can be, e.g., when layer 1030B has a temperature midway between an initial temperature and a temperature of environment 320. In various aspects, layer 1030A is formed from a low-melting-temperature metal such as Wood's metal, Field's metal, Cerrosafe, Rose's metal, or other compounds having melting points below 100° C. Various bismuth-tin alloys can be used for this purpose. Higher-melting-temperature metals, e.g., tin (which melts at about 232° C.), can also be used.

In various aspects, first layer 1030A is susceptible to heat (e.g., has a specific melting point). Layer 1030B is not susceptible to heat or temperature, so layer 1030A is not considered a void with respect to layer 1030B and seal 1004. When layer 1030A becomes fluid and at least a part moves or otherwise exposes a portion of layer 1030B, the volume formerly occupied by material of layer 1030A is a void. Layer 1030A can be formed from various metals, including Bi—Sn alloys, as described above.

In various aspects, layer 1030A is a first-exposed sensor patch. Patch 1030A consists of an electrically-conductive material and zero or more inclusions (e.g., air bubbles, dust particles, or other non-conductive or less-conductive particles) that together do not reduce the conductivity of the electrically-conductive material by more than fifteen percent. For example, layer 1030A can be a conductive metal. When the metal melts, it flows into cavity 1040. This exposes layer 1030B to environment 320 and also opens a connection between two otherwise separate electrodes formerly connected by layer 1030A.

In various aspects not shown here, first layer 1030A can become a gas on exposure to the corresponding environmental factor, and that gas can dissipate into or through environment 320. This exposes second layer 1030B to environmental factors in environment 320 but does not maintain a seal on layers below second layer 1030B. In various aspects, as shown in FIG. 1A, seal 4 is in contact with layers 2A, 2B, 2C around their perimeters, leaving no cavities. When layer 2C evaporates, layer 2B is permitted to be exposed to environment 320, and seal 4 and layer 2B together protect layer 2A from exposure to environment 320 until layer 2B burns through.

Referring back to FIG. 7, a layer stack (or patch stack) and seal arrangement such as shown in FIGS. 10A-10B can also be used with sensor patches 30. In various aspects, one or more layer(s) (or patch(es); layer(s) can be conductive or not) are disposed over a selected one of the sensor patches 30 in a selected order, as described above with respect to FIG. 1. Each layer is susceptible to a respective environmental factor, so that the selected one of the sensor patches 30 changes conductance in response to exposure of the layer stack to the respective environmental factors of the one or more layer(s) in the selected order and subsequent exposure of the sensor patch 30 to the corresponding environmental factor. Seal 1004 (FIG. 10A) and related components can also be used as described above. Each buried layer or patch can be permitted to be exposed to the respective environmental factor only through respective void(s) in the one or more layer(s) farther from the substrate than that buried layer.

Referring back to FIG. 8, a layer stack (patch stack) and optionally seal 1004 (FIG. 10A) as described above can also be disposed over a selected one of the sensor patches 30A, 30B, 30C, 30D. Layers 30E, 30F, and seal 4 can be as discussed above with respect to FIGS. 10A-10B (layers 1030A, 1030B, 1030C; seal 1004). In an example, sensor patch 30D has disposed over it layer 30E (layer 30F is not used). Sensor patch 30D includes a sensor-patch layer (not shown) susceptible to the environmental factor of sensor patch 30D. The sensor-patch layer has a flow surface adjacent to layer 30E so that when layer 30E is made fluid, the fluid will flow according to a flow pattern along the flow surface of the sensor-patch layer.

Figure 11:
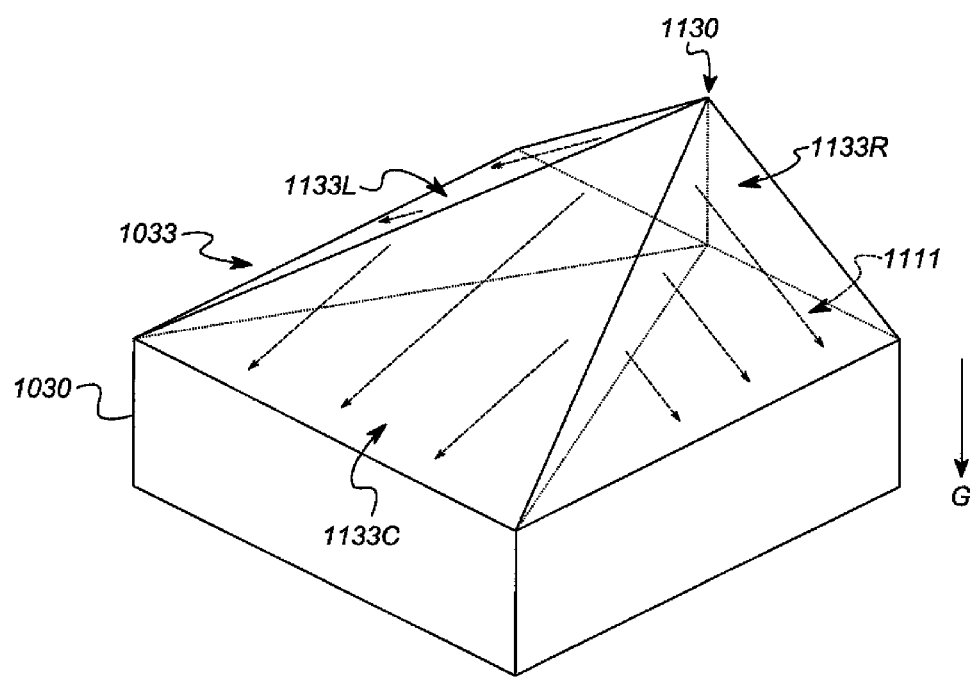
FIG. 11 is an isometric view of a flow surface according to various aspects.

FIG. 11 is an isometric view of a flow surface according to various aspects. Layer 1030 has flow surface 1033. In this example, flow surface 1033 descends from peak 1130 in segments 1133L, 1133C, 1133R (left, center, right), outlined by solid lines. Dotted lines show the projection of the solid lines on the horizontal. Direction G of gravity is straight down in this example. In various aspects, direction G is the direction of the sum of forces acting on the material on top of layer 1030 immediately before that material begins to liquefy.

As a result, when material on top of layer 1030 liquefies, it will flow down segments 1133L, 1133C, 1133R according to flow pattern 1111 (dashed arrows). Gravity pulls fluid disposed over each segment 1133L, 1133C, 1133R along that segment and away from peak 1130. Flow pattern 1111 indicates the directions and velocities fluid is likely to flow along flow surface 1033. Fluid may flow in other directions due to localized or unanticipated forces acting on the fluid, but will generally follow the flow pattern. In general, the fluid pattern at any point is the vector sum of the forces acting on the fluid at that point.

Figure 12:
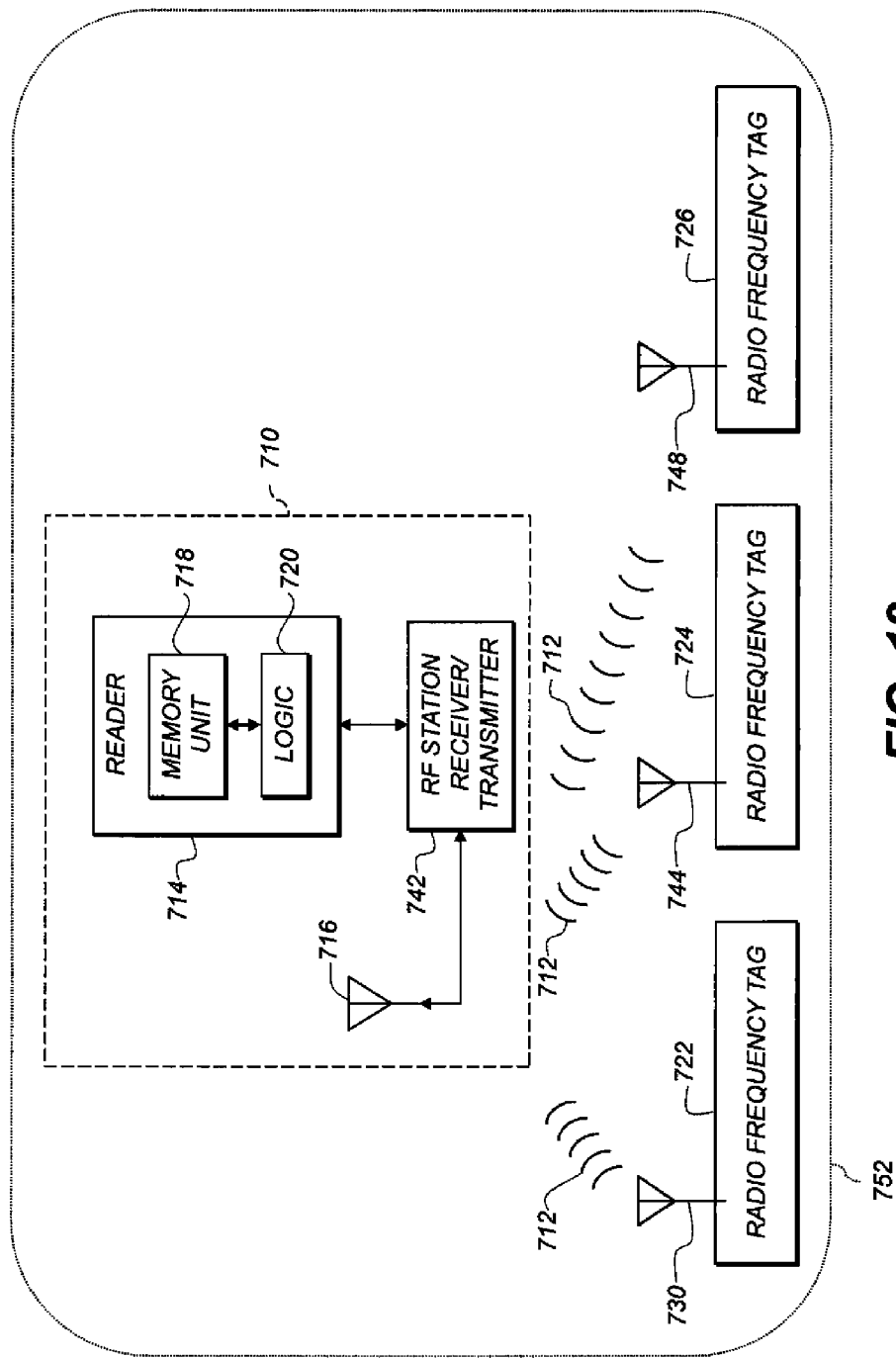
FIG. 12 is a block diagram of an RFID system according to various aspects.

FIG. 12 is a block diagram of an RFID system according to various aspects. Base station 710 communicates with three RF tags 722, 724, 726, which can be active or passive in any combination, via a wireless network across an air interface 712. FIG. 12 shows three tags, but any number can be used. Base station 710 includes reader 714, reader's antenna 716 and RF station 742. RF station 742 includes an RF transmitter and an RF receiver (not shown) to transmit and receive RF signals via reader's antenna 716 to or from RF tags 722, 724, 726. Tags 722, 724, 726 transmit and receive via respective antennas 730, 744, 748.

Reader 714 includes memory unit 718 and logic unit 720. Memory unit 718 can store application data and identification information (e.g., tag identification numbers) or SG TINs of RF tags in range 752 (RF signal range) of reader 714. Logic unit 720 can be a microprocessor, FPGA, PAL, PLA, or PLD. Logic unit 720 can control which commands that are sent from reader 714 to the tags in range 752, control sending and receiving of RF signals via RF station 742 and reader's antenna 716, or determine if a contention has occurred.

Reader 714 can continuously or selectively produce an RF signal when active. The RF signal power transmitted and the geometry of reader's antenna 716 define the shape, size, and orientation of range 752. Reader 714 can use more than one antenna to extend or shape range 752.

RFID standards exist for different frequency bands, e.g., 125 kHz (LF, inductive or magnetic-field coupling in the near field), 13.56 MHz (HF, inductive coupling), 433 MHz, 860-960 MHz (UHF, e.g., 915 MHz, RF coupling beyond the near field), or 2.4 GHz. Tags can use inductive, capacitive, or RF coupling (e.g., backscatter) to communicate with readers.

Radio frequency identification systems are typically categorized as either "active" or "passive." In an active RFID system, tags are powered by an internal battery, and data written into active tags can be rewritten and modified. In a passive RFID system, tags operate without an internal power source and are typically programmed with a unique set of data that cannot be modified. A typical passive RFID system includes a reader and a plurality of passive tags. The tags respond with stored information to coded RF signals that are typically sent from the reader. Further details of RFID systems are given in commonly-assigned U.S. Pat. No. 7,969,286 to Adelbert, and in U.S. Pat. No. 6,725,014 to Voegele, both of which are incorporated herein by reference.

In a commercial or industrial setting, tags can be used to identify containers of products used in various processes. A container with a tag affixed thereto is referred to herein as a "tagged container." Tags on containers can carry information about the type of products in those containers and the source of those products. A tag on a container can carry the SGTIN(s) for item(s) in the container.

Figure 13:
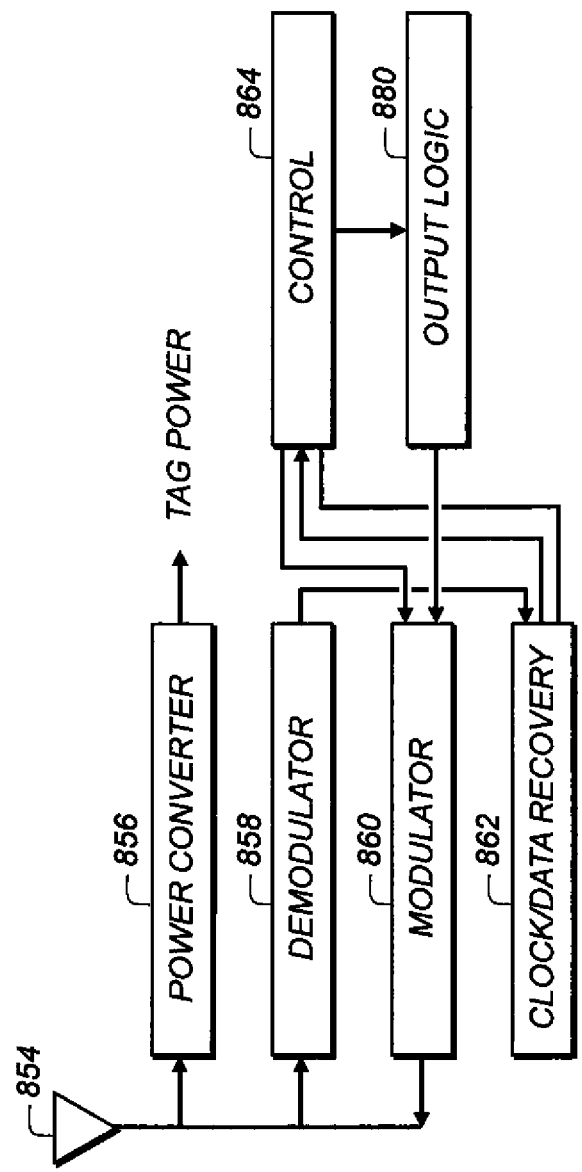
FIG. 13 is a block diagram of a passive RFID tag according to various aspects.

FIG. 13 is a block diagram of a passive RFID tag (e.g., tags 722, 724, 726 shown in FIG. 12) according to various aspects. The tag can be a low-power integrated circuit, and can employ a "coil-on-chip" antenna for receiving power and data. The RFID tag includes antenna 854 (or multiple antennas), power converter 856, demodulator 858, modulator 860, clock/data recovery circuit 862, control unit 864, and output logic 880. Antenna 854 can be an omnidirectional antenna impedance-matched to the transmission frequency of reader 714 (FIG. 12). The RFID tag can include a support, for example, a piece of polyimide (e.g., KAPTON) with pressure-sensitive adhesive thereon for affixing to packages. The tag can also include a memory (often RAM in active tags or ROM in passive tags) to record digital data, e.g., an SGTIN.

Reader 714 (FIG. 12) charges the tag by transmitting a charging signal, e.g., a 915 MHz sine wave. When the tag receives the charging signal, power converter 856 stores at least some of the energy received by antenna 854 in a capacitor, or otherwise stores energy to power the tag during operation.

After charging, reader 714 transmits an instruction signal by modulating onto the carrier signal data for the instruction signal, e.g., to command the tag to reply with a stored SGTIN. Demodulator 858 receives the modulated carrier bearing those instruction signals. Control unit 864 receives instructions from demodulator 858 via clock/data recovery circuit 862, which can derive a clock signal from the received carrier. Control unit 864 determines data to be transmitted to reader 714 and provides it to output logic 880. For example, control unit 864 can retrieve information from a laser-programmable or fusible-link register on the tag. Output logic 880 shifts out the data to be transmitted via modulator 860 to antenna 854. The tag can also include a cryptographic module (not shown). The cryptographic module can calculate secure hashes (e.g., SHA-1) of data or encrypt or decrypt data using public- or private-key encryption. The cryptographic module can also perform the tag side of a Diffie-Hellman or other key exchange.

Signals with various functions can be transmitted; some examples are given in this paragraph. Read signals cause the tag to respond with stored data, e.g., an SGTIN. Command signals cause the tag to perform a specified function (e.g., kill). Authorization signals carry information used to establish that the reader and tag are permitted to communicate with each other.

Passive tags typically transmit data by backscatter modulation to send data to the reader. This is similar to a radar system. Reader 714 continuously produces the RF carrier sine wave. When a tag enters the reader's RF range 752 (FIG. 12; also referred to as a "field of view") and receives, through its antenna from the carrier signal, sufficient energy to operate, output logic 880 receives data, as discussed above, which is to be backscattered.

Modulator 860 then changes the load impedance seen by the tag's antenna in a time sequence corresponding to the data from output logic 880. Impedance mismatches between the tag antenna and its load (the tag circuitry) cause reflections, which result in momentary fluctuations in the amplitude or phase of the carrier wave bouncing back to reader 714. Reader 714 senses occurrences and timing of these fluctuations and decodes them to receive the data clocked out by the tag. In various aspects, modulator 860 includes an output transistor (not shown) that short-circuits the antenna in the time sequence (e.g., short-circuited for a 1 bit, not short-circuited for a 0 bit), or opens or closes the circuit from the antenna to the on-tag load in the time sequence. In another aspect, modulator 860 connects and disconnects a load capacitor across the antenna in the time sequence. Further details of passive tags and backscatter modulation are provided in U.S. Pat. No. 7,965,189 to Shanks et al. and in "Remotely Powered Addressable UHF RFID Integrated System" by Curty et al., IEEE Journal of Solid-State Circuits, vol. 40, no. 11, November 2005, both of which are incorporated herein by reference. As used herein, both backscatter modulation and active transmissions are considered to be transmissions from the RFID tag. In active transmissions, the RFID tag produces and modulates a transmission carrier signal at the same wavelength or at a different wavelength from the read signals from the reader.

Voltage values associated with a ground signal or a voltage signal can be chosen to suit the needs of the integrated circuits, power supplies, and other electronic elements. The present invention is not limited to any particular voltage ranges or differences, either positive or negative, used to provide power, excitation signals, or detection signals. For example, a negative voltage V− can be used with a ground signal as well as a positive voltage V+.

The invention is inclusive of combinations of the aspects described herein. References to "a particular aspect" and the like refer to features that are present in at least one aspect of the invention. Separate references to "an aspect" or "particular aspects" or the like do not necessarily refer to the same aspect or aspects; however, such aspects are not mutually exclusive, unless so indicated or as are readily apparent to one of skill in the art. The use of singular or plural in referring to the "method" or "methods" and the like is not limiting. The word "or" is used in this disclosure in a non-exclusive sense, unless otherwise explicitly noted. The invention has been described in detail with particular reference to certain preferred aspects thereof, but it will be understood that variations, combinations, and modifications can be effected by a person of ordinary skill in the art within the spirit and scope of the invention.

PARTS LIST 2A, 2B, 2C layer
3 layer stack
4, 4A seal
5 electronic sensing system
9 detection region
10 substrate
11 planarization layer
12 output pad
13 seal
14 input pad
16 code circuit
20 transceiver
21 transceiver substrate
22 excitation circuit
24 detection circuit
26 interface
28 antenna
30, 30A, 30B, 30C, 30D, 30E, 30F sensor patch
42 memory
56 electrical connector
57 electrode
74 security circuit
80 downlink signal
82 uplink signal
88 controller
89 reader
302C electrically-conductive layer
309Z electrically-insulating layer
310 sensor patch
312C electrically-conductive layer
319Z electrically-insulating layer
320 environment
403W window
403Z electrically-insulating layer
405C conductor
503 patch stack
512, 514 conductor
530A, 530B, 530C sensor patch
710 base station
712 air interface
714 reader
716 reader's antenna
718 memory unit
720 logic unit
722, 724, 726 RFID tag
730, 744, 748 antenna
742 RF station
752 range
803 patch stack
854 antenna
856 power converter
858 demodulator
860 modulator
862 clock/data recovery circuit
864 control unit
880 output logic
905 dispose sensor patches step
910 expose code circuit step
919 expose multiple circuits step
920 check code circuit step
925 compare with criterion step
929 check multiple circuits step
930 store electrical signal step
935 transmit signal step
939 store signals step
940 interval elapsed? decision step
1003 layer stack
1004 seal
1030 layer
1030A first-exposed layer
1030B second-exposed layer
1030C, 1030D layer
1031A mass
1033 flow surface
1040 cavity
1111 flow pattern
1130 peak
1133L, 1133C, 1133R segment
G direction of gravity

The invention claimed is:

1. An electronic sensing system, comprising:
a substrate with a detection region;
a transceiver formed on a transceiver substrate separate from the substrate and affixed to the substrate, the transceiver including an output pad for making an electrical connection, an excitation circuit adapted to provide an excitation signal to the output pad, an input pad for making an electrical connection, a detection circuit connected to the input pad, and an interface responsive to a downlink signal to transmit an uplink signal representing the electrical state of the input pad; and a plurality of sensor patches disposed over the substrate, each sensor patch disposed at least partly in the detection region, having a conductance susceptible to a respective environmental factor, and being electrically conductive before exposure to the respective environmental factor; wherein the sensor patches are distributed over the substrate so that they are exposed to an external environmental factor substantially contemporaneously and the output pad is electrically connected to the input pad through the plurality of sensor patches in series, so that the detection circuit detects an electrical state of the input pad in response to the excitation signal and the respective conductances of each of the plurality of sensor patches; and further including one or more layer(s) disposed over a selected one of the plurality of sensor patches in a selected order, each of the one or more layer(s) susceptible to a respective environmental factor, so that the selected sensor patch changes conductance in response to exposure of the one or more layer(s) to the respective environmental factors of the one or more layer(s) in the selected order and subsequent exposure of the selected sensor patch to the corresponding environmental factor.

2. The electronic sensing system according to claim 1, wherein one of the plurality of sensor patches includes an electrically-conductive layer susceptible to the corresponding environmental factor.

3. The electronic sensing system according to claim 1, wherein one of the plurality of sensor patches includes an electrically-insulating layer and a conductor arranged on a side of the layer closer to the substrate, the layer and the conductor susceptible to the corresponding environmental factor.

4. The electronic sensing system according to claim 1, wherein one of the plurality of sensor patches includes an electrically-insulating layer and a conductor arranged on a side of the layer closer to the substrate, the layer susceptible to the corresponding environmental factor and the conductor susceptible to a respective environmental factor different from the corresponding environmental factor of the layer.

5. The electronic sensing system according to claim 1, wherein the environmental factors are liquids or gasses.

6. The electronic sensing system according to claim 1, further including a seal lower in susceptibility to the respective environmental factors of each of the layer(s) and the selected sensor patch than each of the layer(s) and the selected sensor patch, respectively, the seal being arranged so that the selected sensor patch is permitted to be exposed to the respective environmental factor only through a void in a layer of the layer(s) adjacent to the sensor patch.

7. The electronic sensing system according to claim 6, wherein the one or more layer(s) include a first-exposed layer and one or more buried layer(s) arranged between the first-exposed layer and the selected sensor patch, and the seal is arranged so that each of the buried layer(s) is permitted to be exposed to the respective environmental factor only through respective void(s) in one or more of the layer(s) farther from the substrate than that buried layer.

8. The electronic sensing system according to claim 7, wherein:

the one or more buried layer(s) includes a second-exposed layer adjacent to the first-exposed layer;

the seal and the one or more layer(s) are arranged to define a cavity between them, the cavity sealed off from the environmental factors of the sensor patch and the one or more layer(s) by the seal and the first-exposed layer;

the one or more layer(s) are arranged so that the second-exposed layer has a flow surface adjacent to the first-exposed layer and having a shape, orientation, or composition that defines a flow pattern; and the first-exposed layer is made fluid by exposure to the corresponding environmental factor, so that when the first-exposed layer becomes fluid, at least some of the resulting fluid travels substantially according to the flow pattern into the cavity to permit the second-exposed layer to be exposed to the corresponding environmental factor.

9. The electronic sensing system according to claim 7, wherein the first-exposed layer is susceptible to heat and has a selected thermal conductance greater than a thermal conductance of the seal.

10. An electronic sensing system, comprising:

a substrate with a detection region;

a transceiver formed on a transceiver substrate separate from the substrate and affixed to the substrate, the transceiver including an output pad for making an electrical connection, an excitation circuit adapted to provide an excitation signal to the output pad, an input pad for making an electrical connection, a detection circuit connected to the input pad, and an interface responsive to a downlink signal to transmit an uplink signal representing the electrical state of the input pad; and a plurality of sensor patches disposed over the substrate, each sensor patch disposed at least partly in the detection region, having a conductance susceptible to a respective environmental factor, and being electrically conductive before exposure to the respective environmental factor, the sensor patches distributed over the substrate so that they are exposed to an external environmental factor substantially contemporaneously; wherein the output pad is electrically connected to the input pad through the plurality of sensor patches in parallel, so that the detection circuit detects an electrical state of the input pad in response to the excitation signal and the respective conductances of each of the plurality of sensor patches; and further including one or more layer(s) disposed over a selected one of the sensor patches in a selected order, each of the layer(s) susceptible to a respective environmental factor, so that the selected one of the sensor patches changes conductance in response to exposure of the one or more layer(s) to the respective environmental factors of the one or more layer(s) in the selected order and subsequent exposure of the selected sensor patch to the corresponding environmental factor.

11. The electronic sensing system according to claim 10, wherein each of the sensor patches has a respective, different electrical resistance.

12. The electronic sensing system according to claim 11, wherein the respective electrical resistances of each of the sensor patches form a logarithmic or exponential series.

13. The electronic sensing system according to claim 10, wherein one of the plurality of sensor patches includes an electrically-conductive layer susceptible to the corresponding environmental factor.

14. The electronic sensing system according to claim 10, wherein one of the plurality of sensor patches includes an electrically-insulating layer and a conductor arranged on a side of the electrically-insulating layer closer to the substrate, the electrically-insulating layer and the conductor susceptible to the corresponding environmental factor.

15. The electronic sensing system according to claim 10, wherein one of the plurality of sensor patches includes an electrically-insulating layer and a conductor arranged on a side of the layer closer to the substrate, the electrically-insulating layer susceptible to the corresponding environmental factor and the conductor susceptible to a respective environmental factor different from the corresponding environmental factor of the electrically-insulating layer.

16. The electronic sensing system according to claim 10, wherein the electrical state of the input pad represents a detected resistance of the plurality of sensor patches wired in parallel, and wherein the transceiver further includes a controller and a memory adapted to store a plurality of thresholds, the controller adapted to compare the detected resistance to one or more of the stored thresholds and automatically transmit the uplink signal whenever the detected resistance crosses one of the stored thresholds to which the detected resistance has been compared.

17. The electronic sensing system according to claim 10, wherein the environmental factors are liquids or gasses.

18. The electronic sensing system according to claim 10, further including a seal lower in susceptibility to the respective environmental factors of the one or more layer(s) and the selected sensor patch than the one or more layer(s) and the sensor patch, respectively, the seal being arranged so that the sensor patch is permitted to be exposed to the respective environmental factor only through a void in the layer adjacent to the sensor patch.

19. The electronic sensing system according to claim 18, wherein the one or more layer(s) include a first-exposed layer and one or more buried layer(s), and the seal is arranged so that each of the buried layer(s) is permitted to be exposed to the respective environmental factor only through respective void(s) in the one or more layer(s) farther from the substrate than that buried layer.

20. The electronic sensing system according to claim 19, wherein:
the one or more buried layer(s) includes a second-exposed layer adjacent to the first-exposed layer;
the seal and the one or more layer(s) are arranged to define a cavity between them, the cavity sealed off from the environmental factors of the sensor patch and the layers by the seal and the first-exposed layer;
the one or more layer(s) are arranged so that the second-exposed layer has a flow surface adjacent to the first-exposed layer, the flow surface having a shape, orientation, or composition that defines a flow pattern; and
the first-exposed layer is made fluid by exposure to the corresponding environmental factor, so that when the first-exposed layer becomes fluid, at least some of the resulting fluid travels substantially according to the flow pattern into the cavity to permit the second-exposed layer to be exposed to the corresponding environmental factor.

21. The electronic sensing system according to claim 20, wherein the first-exposed layer is susceptible to heat and has a selected thermal conductance greater than a thermal conductance of the seal.

* * * * *